(12) United States Patent
Keller et al.

(10) Patent No.: US 7,359,843 B1
(45) Date of Patent: Apr. 15, 2008

(54) ROBUST CALCULATION OF CROSSTALK DELAY CHANGE IN INTEGRATED CIRCUIT DESIGN

(75) Inventors: Igor Keller, Sunnyvale, CA (US); Kenneth Tseng, Cupertino, CA (US); Nishath Verghese, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 266 days.

(21) Appl. No.: 10/735,123

(22) Filed: Dec. 12, 2003

Related U.S. Application Data

(60) Provisional application No. 60/504,127, filed on Sep. 19, 2003.

(51) Int. Cl.
G06F 17/10 (2006.01)
(52) U.S. Cl. .................. 703/2; 703/19; 716/6
(58) Field of Classification Search .................. 703/19, 703/13, 2; 716/6
See application file for complete search history.

(56) References Cited

U.S. PATENT DOCUMENTS

| | | | |
|---|---|---|---|
| 6,253,361 B1 * | 6/2001 | Buch | 716/6 |
| 6,587,815 B1 * | 7/2003 | Aingaran et al. | 703/13 |
| 7,065,720 B2 | 6/2006 | Croix | |

OTHER PUBLICATIONS

Blaauw et al., D. Driver Modeling and Alingment for Worst-Case Delay Noise, IEEE Transactions on Very Large Scale Integration (VLSI) Systems, vol. 11, No. 2, Apr. 2003, pp. 157-166.*

Chen et al., W-C. Analytical Models for Crosstalk Excitation and Propagation in VLSI Circuits, IEEE Transactions on Computer-Aided Design of Integrated Circuits and Systems, vol. 21, No. 10, Oct. 2002, pp. 1117-1131.*

Sasaki et al., Y. Crosstalk Delay Analysis of a 0.13-μm Node test Chip and Precise Gate-Level Simulation Technology, IEEE Journal of Solid-State Circuits, vol. 38, No. 5, May 2003, pp. 702-708.*

Phadoongsidhi et al., M. A Concurrent Fault Simulation for Crosstalk Faults in Sequential Circuits, Proceedings of the 11th Asian Test Symposium, Nov. 2002, pp. 182-187.*

Keller, Igor et al., "A robust cell-level crosstalk delay change analysis," Institute of Electrical and Electronic Engineers, Nov. 8, 2004, New York, New York, U.S.A., pp. 147-154.

R. Arunachalam et al., "TACO: Timing Analysis With COupling", ACM 2000, 4 pgs.

P. Chen et al., "Miller Factor for Gate-Level Coupling Delay Calculation", IEEE, International Conference on Computer Aided Design, 2000, 7 pgs.

(Continued)

Primary Examiner—Russell Frejd
(74) Attorney, Agent, or Firm—Stephen C. Durant; Novak Druce + Quigg LLP

(57) ABSTRACT

A method of delay change determination in an integrated circuit design including a stage with a victim net and one or more aggressor nets capacitively coupled thereto, the method comprising: determining a nominal (noiseless) victim net signal transition; determining a noisy victim net signal transition; and determining a delay change based upon nominal and noisy victim signal transition arrival times at a victim net receiver output.

56 Claims, 18 Drawing Sheets

OTHER PUBLICATIONS

J.F. Croix et al., "Blade and Razor: Cell and Interconnect Delay Analysis Using Current-Based Models", DAC Jun. 2-6, 2003, Anaheim CA, pp. 386-389.

F. Dartu et al., "Calculating Worst-Case Gate Delay Due to Dominant Capacitance Coupling", DAC 97, Anaheim CA, 6 pgs., 1997.

P. D. Gross et al., "Determination of Worst-Case Aggressor Alignment for Delay Calculation", ACM 1998, pp. 212-219.

I. Keller et al., "A robust cell-level crosstalk delay change analysis", 8 pgs, Nov. 2004.

I. Keller et al., "On a robust noise-on-delay cell-level analysis", 7 pgs, date unavailable.

A. Odabasioglu et al., "PRIMA: Passive Reduced-Order Interconnect Macromodeling Algorithm", IEEE Transactions on Computer Aided Design of Integrated Circuits and Systems, vol. 17, No. 8, Aug. 1998, pp. 645-654.

V. Raghavan et al., "AWESpice: A General Tool for the Accurate and Efficient Simulation of Interconnect Problems", 29th ACM/IEEE Design Automation Conference, paper 6.3, 1992, pp. 87-92.

K. Shepard, "Design Methodologies for Noise in Digital Integrated Circuits", 35th Design Automation Conference, ACM 1998, 6 pgs.

S. Sirichotiyakul et al., "Driver Modeling and Alignment for Worst-Case Delay Noise", IEEE Trans. on Very Large Scale Integration v. 11, No. 2, Apr. 2003, 6 pgs.

V. Zolotov et al., "Noise Propagation and Failure Criteria for VLSI Designs", IEEE 2002, 8 pgs.

* cited by examiner

| $V_{in}/V_{out}$ | $V_{o0}$ | $V_{o1}$ | $V_{o2}$ | ... | $V_{oN}$ |
|---|---|---|---|---|---|
| $V_{i0}$ | $I_{00}$ | $I_{01}$ | $I_{02}$ | ... | $I_{0N}$ |
| $V_{i1}$ | $I_{10}$ | $I_{11}$ | $I_{12}$ | --- | $I_{1N}$ |
| $V_{i2}$ | $I_{20}$ | $I_{21}$ | $I_{22}$ | --- | $I_{2N}$ |
| . . . | . . . | . . . | . . . | . . . | . . . |
| $V_{iM}$ | $I_{M0}$ | $I_{M1}$ | $I_{M2}$ | ... | $I_{MN}$ |

FIG. 7

ROBUST CALCULATION OF CROSSTALK DELAY CHANGE IN INTEGRATED CIRCUIT DESIGN

CROSS-REFERENCE TO RELATED APPLICATION

This application claims priority of a provisional Application filed Sep. 19, 2003, Ser. No. 60/504,127, the entire contents of which are incorporated herein by reference.

BACKGROUND OF THE INVENTION

1. Field of the Invention

The invention relates in general to integrated electronic circuits, and more particularly, to timing analysis in electronic circuit design and testing.

2. Description of the Related Art

Recent advances in process technology scales the aspect ratio of wires to be taller and thinner to control wire resistance. A side effect of this scaling is that coupling capacitance between wires becomes the dominant portion of the total wire capacitance. See, K. L. Shepard, "Design methodologies for noise in digital integrated circuits", *Proceedings of the Design Automation Conference*, pages 94-99, June 1998; and F. Dartu, L. Pileggi, "Calculating worst-case gate delays due to dominant capacitance coupling", *Proceedings of the Design Automation Conference*, pages 46-51, June 1997. At the same time, the signal transition times have become faster resulting in stronger aggressors on adjacent victim wires. See, F. Dartu et al. Another side effect of process advancement is the faster scaling of cell internal delay than the interconnect delay, making accurate analysis of interconnect delay important.

The importance of the crosstalk effects on delay has grown significantly with recent technology advances. For example, crosstalk delay has become a more prominent element of timing analysis during integrated circuit design due to factors such as, (i) increase in coupling-to-total capacitance ratio, (ii) decrease in supply voltage resulting in a reduction of gate overdrive (iii) shortening of clock period causing transition waveforms to play a bigger role, and (iv) tighter timing margins requiring more accurate timing analysis and less overestimation of delay.

Delay calculation in the presence of crosstalk typically involves finding a worst-case delay among possible aggressor alignments and aggressor waveforms. Determination of delay in the presence of aggressor-induced noise is a challenging task due to factors such as, (i) delay being sensitive to aggressor/victim alignment, (ii) linear models for switching drivers potentially being inaccurate due to drastic variation of impedance during transition, (iii) effective capacitance principle requiring modification (See, F. Dartu et al), and (iv) waveforms potentially becoming irregular in the presence of noise, making the conventional metric of delay measurement non-robust.

In view of the sensitivity of crosstalk delay to factors such as, aggressor alignment, the nonlinearity of drivers, and aggressor timing window constraints, a search for the worst-case (WC) alignment may be approached using constrained nonlinear optimization techniques. However, optimization in a multidimensional space of aggressor alignments with each iteration requiring simulation of a nonlinear circuit can be prohibitively expensive. The crosstalk delay analysis task is further complicated by the potential for a unique waveform response of each receiver of a victim net to a given input transition, such that a WC aggressor alignment for one receiver may not be the same for another.

Another challenge with analyzing a crosstalk induced delay change arises from the potential for crosstalk to distort a victim switching waveform. A distorted waveform may deviate from the input waveforms used in delay characterization of a receiving gate, resulting in inaccuracy in slew dependent delays in a downstream logic cone. If the crosstalk impact is severe, the victim waveform may even become non-monotonic (bumpy), the effect of which may not be properly modeled in existing gate delay systems.

There have been prior proposals for analysis of crosstalk induced delay. R. Arunachalam, K. Rajagopal, and L. Pileggi, Taco, "Timing analysis with coupling". *Proceedings of the Design Automation Conference*, pages 266-269, June 2000 teach that static timing analysis (STA) can be used to calculate delay while accounting for effects of switching aggressors using a heuristic-based Miller factor, which is applied to coupling capacitance before it is grounded. This approach is believed to be too conservative and inaccurate to be successfully used for modern design constraints. Another approach is based on computation of a noisy transition—transition in the presence of switching aggressors, and using it for determining new slews and delays. In several studies the linear superposition principle was applied to the nominal transition with a noisy waveform on the victim net computed separately. See, F. Dartu, et al.; R. Arunachalam, et al.; and P. D. Gross, R. Arunachalam, K. Rajagopal, and L. Pileggi, "Determination of worst-case aggressor alignment for delay calculation", *Proceedings of the ICCAD*, pages 212-219, November 1998. The nominal transition is computed using a linear Thevenin model for the victim driver with all aggressors kept quiet. The alignment between nominal transition on the victim and transitions on the aggressors was chosen based on noise pulse width and height. However, since the noise wave was computed for a quiet victim driver and not a switching one, the alignment used in the mentioned studies could be inaccurate.

S. Sirichotiyakul, D. Blaauw, C. Oh, R. Levy, V. Zolotov, and J. Zuo, "Driver modeling and alignment for worst-case delay noise", *Proceedings of the Design Automation Conference*, pages 720-725, June 2001, proposed that alignment between the victim and aggressors should be determined using characteristics of a receiving gate. The proposed approach is based on a pre-characterized 4-D look-up table representing alignment as a function of nominal slew rate, noise peak and width on the victim net and output load of receiving gate.

Current-based models for gates have been proposed. See, J. F. Croix, and D. F. Wong, "Blade and Razor: Cell and Interconnect Delay Analysis Using Current-Based Models", In *Proceedings of the Design Automation Conference*, 386-391, June 2003; and V. Zolotov, D. Blaauw, S. Sirichotiyakul, M. Becer, C. Oh, R. Panda, A. Grinshpon and R. Levy, "Noise propagation and failure criterion for VLSI designs" *Proceedings of the ICCAD, pages* 587-594, November 2002. However, there is no teaching of how such current model is to be integrated in a flow of crosstalk delay change analysis.

FIGS. 14A and 14B illustrate one aspect of a prior methodology for measurement of aggressor-induced crosstalk delay. FIG. 14A is an illustrative drawing of a set of curves that represent victim signal transitions from $V_{DD}$ to ground. Each curve represents a different alignment of a victim signal transition with an aggressor signal. In each case, the aggressor signal induces a bump in the victim signal transition. The curves are non-monotonic due to the aggressor-induced bumps. Victim net signal transition delay is measured in terms of the time at which the victim signal crosses the $V_{ref}$ level. The curves of FIG. 14A illustrate that an aggressor-induced bump can cause the victim signal to cross $V_{ref}$ multiple times. A second crossing increases the measured victim signal transition delay according to the conventional methodology, since the delay should be measured based on the latest crossing of $V_{ref}$.

FIG. 14B is an illustrative drawing of a curve representing victim signal transition delay versus aggressor alignment. The heavy dots on the delay curve denote correspondent crossing times of $V_{ref}$ on the noisy transitions shown in FIG. 14A. The curve of FIG. 14B shows that victim signal transition delay depends upon aggressor alignment. Unfortunately, the non-monotonic waveforms of FIG. 14A result in a 'cliff' in the curve of FIG. 14B methodology. The last curve in FIG. 14A does not have a bump crossing $V_{ref}$, which engenders the cliff in delay curve in FIG. 14B. This prior methodology is not robust because even a relatively small change in a circuit parameter (e.g., driver size, supply voltage, etc) and/or aggressor alignment on a particular victim net can result in a disproportionate change in measured victim signal delay due to the such cliff.

Thus, there has been a need for more robust and accurate measurement of aggressor induced crosstalk delay. The present invention meets this need.

SUMMARY OF THE INVENTION

In one aspect, an embodiment of the invention provides a method of delay change measurement in an integrated circuit design including a stage with a victim net and one or more aggressor nets capacitively coupled thereto in an interconnect network. The delay change determination is made with reference to the time required for a victim net signal transition to reach an output of a victim net receiver, which smoothes aggressor-induced bumps in a victim transition and thereby leads to a more robust delay change determination. In general, the method involves determining nominal (noiseless) delay of a victim net signal transition; determining noisy delay of a victim net signal transition, i.e., delay in the presence of one or more switching aggressors-aggressors undergoing transitions; and comparing the nominal and noisy delays to ascertain aggressor induced delay change. More particularly, in one embodiment, the method involves determining nominal victim net signal transition delay in propagating a signal transition from a victim net driver input to a victim net receiver input and further propagating the victim signal transition from the input to an output of the victim net receiver with the victim's aggressor nets held at the same voltage (ground of supply). Determining noisy victim net signal transition delay involves propagating a signal transition from the victim net driver input to the victim net receiver input while accounting for at least one aggressor undergoing a transition by imparting the respective aggressor-induced current and voltage waveforms during calculation of the transition on the receiver input. Determining noisy victim net signal transition delay also involves further propagating the noisy victim signal transition from the input to an output of the victim receiver. Aggressor induced delay change is the difference between nominal and noisy victim signal transition delays.

In another aspect, an embodiment of the invention provides an input/output voltage-dependent current model of a gate, which is used to calculate realistic transition waveforms all aggressor nets and finally determine the aggressors-induced delay change in victim nets of an integrated circuit design. The disclosed current model provides an accurate description of a gate propagating a signal on an electrical level. This is in contrast to a timing-level description used in conventional methodology, where a gate is characterized for a delay and slew as functions of input slew and output load. Usage of the suggested current model has advantages over the timing model as the current model is capable of more accurately accounting for different input transition waveforms that can result from arbitrary signals such as switching aggressors. In accordance with the method, a load model of an interconnect network of the stage is used to propagate waveforms from an input to an output of the driving gate. In one embodiment, the load model of interconnect is a Π-load model which approximates the actual interconnect load as seen by the driver and is calculated from the actual interconnect by matching its electrical characteristics (moments). More specifically, nominal victim driver delay is determined by propagating a nominal signal transition from an input to an output of the victim driver An interconnect model is then used to propagate the driver model output waveform, representing the nominal victim net signal transition at the driver output, to the receiver input. Noisy victim net delay is determined similarly, but in the presence of at least one switching aggressor. More specifically, first a noisy transition is calculated on an output of the driver using the load model of the interconnect and accounting for the switching aggressor by imparting the aggressor-induced current waveform to the victim driver model output. The interconnect model is then used to propagate the noisy driver output waveform to the receiver input, where it is imparted by at least one aggressor-induced voltage waveform The computed waveform describes/represents a noisy transition on receiver input. A difference between the nominal delay and noisy delay as measured on the receiver input represents a aggressor-induced delay change, which in one embodiment is annotated to a static timing analysis tool for signal propagation. In another embodiment this delay change is computed by propagation of both nominal and noisy transitions to an output of the receiver, where the delay change is calculated and assigned to the input of the receiver. The propagation of the waveforms from the input to output of the receiver is done using a current model for the receiver and a load model for its driven interconnect.

In another aspect, an embodiment of the invention provides a method of producing aggressor-induced victim net waveforms. This method allows for an efficient separation of repeating (constant) computation part of the delay change analysis, and therefore achieving computational efficiency. More specifically, in one embodiment, delay change analysis involves multiple simulations where the aggressors are time-aligned differently with victim at each simulation. The proposed method suggests usage of the pre-computed aggressor-induced current and voltage waveforms that are aligned accordingly at each simulation, instead of inclusion of all aggressor nets in the simulation. In order to pre-compute the current and voltage waveforms and to propagate waveforms from driver output to receivers input, a computational model of an interconnect network of a stage is produced. The computational model can be used to compute a victim net waveform from an aggressor net waveform. In one embodiment, the computational model of the interconnect network of a given stage comprises an H-parameter matrix and a Y-parameter matrix. The H-parameter matrix represents a transfer function, which is used to relate the voltage at each driver port to the voltage at a receiver input of interest. The Y-parameter matrix is an admittance matrix used to relate voltage on one port to current on another port (off-diagonal elements of the Y-parameter matrix). A pre-computed aggressor net waveform is input to the computational model in order to produce the aggressor-induced victim net waveform. In one embodiment, respective pre-computed aggressor net waveforms effectively account for a presence of neighbor nets of respective aggressor nets (so-called second-order aggressors), while in a conventional methodologies these are neglected.

In another aspect, an embodiment of the invention provides a method of optimizing alignment of one or more aggressor waveforms with a victim signal transition waveform in order to speed the identification of worst case alignment. In one embodiment, the suggested method of search of the worst-case alignment is based on a technique of quadratic optimization under constraints. The method involves determining respective delays associated with a victim net signal transition from the victim driver to the victim receiver, while the at least one aggressor-induced victim net waveform is imparted to the victim net, for each of multiple alignments of the at least one provided waveform with the victim net signal transition. A next alignment of the victim net signal transition and the at least one provided waveform is interpolated based upon previously determined delays. The next alignment is selected to result in a worse delay than prior alignments. By worse delay, it is meant that the alignment tends to increase the victim signal transition delay where maximum delay pushout is measured, and it is meant that the alignment tends to reduce the victim signal transition delay where maximum delay pullin is measured. In one embodiment, the prediction of next alignment is done based on quadratic interpolation of the delays from several previous iterations and then using the determined quadratic function for predicting next trial alignment. The iterative process is repeated until convergence, that is, when two consecutive delays are close, or a prescribed limit of iterations is reached.

These and other aspects and features, advantages of the invention will be appreciated from the following detailed description of embodiments thereof in conjunction with the appended drawings.

BRIEF DESCRIPTION OF THE DRAWINGS

FIG. 7 is a two-dimensional (2D) current table representing the non-linear ViVo current model of FIG. 6B.

FIG. 14A is in illustrative drawing of a set of curves that represent the impact of different aggressor alignments with a victim signal; and FIG. 14B is an illustrative drawing of a curve representing victim signal transition delay versus aggressor alignment for the curves of FIG. 14A.

DETAILED DESCRIPTION OF THE PREFERRED EMBODIMENTS

Figure 1:
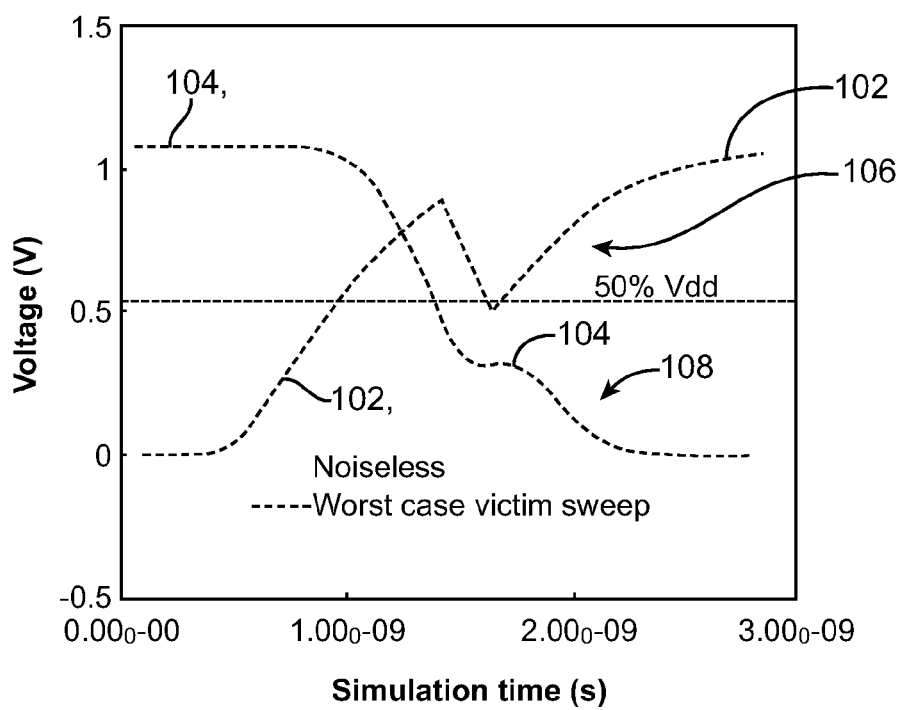
FIG. 1 shows a signal diagram showing an example of a type of problem associated with aggressor alignment and delay measurement based on a predefined waveform crossing threshold.

The present invention provides a novel method and apparatus for crosstalk analysis for use during integrated circuit design and testing. Crosstalk between victim net and an aggressor net can induce signal delay change in the victim net. The following description is presented to enable any person skilled in the art to make and use the invention. The embodiments of the invention are described in the context of particular applications and their requirements. These descriptions of specific applications are provided only as examples. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Introduction

As used herein, a net basically consists of the wires that interconnect components in an integrated circuit design. For instance, a net may interconnect one or more drivers with one or more receivers. Such drivers and receivers may comprise any one or more of a variety of types of components such as, NAND, AND, NOR, OR or INVERT gates, for example. Each of these interconnected components typically is modelled as a cell in an integrated circuit (IC) design. Thus, for example, a cell model of an INVERT gate in an IC design specifies the performance characteristics of an actual INVERT gate in an actual IC. A reference in a design to a particular type of component (e.g., gate) actually references a cell model for the gate.

A victim net is a net for which crosstalk delay change is to be analyzed. An aggressor net is a net coupled through parasitic capacitance to the victim net. A stage is a victim net, its aggressor nets and their driving gates. It will be appreciated that a given net may be characterized as a victim net at one point in a timing analysis and may be characterized as an aggressor net at other points in the timing analysis.

Crosstalk delay change is a difference between crosstalk delay and nominal delay. Crosstalk (stage) delay change is the extra delay in a victim net state change (switching from logic 0 to 1 or from logic 1 to 0) induced by transitioning of some or all aggressors of the victim net. In general, for crosstalk delay analysis, the maximum of crosstalk delay change (taken absolute value) is of greatest interest. The delay change is positive when victim and aggressors switch in opposite directions and it is used for late arrival time calculation (often referred to as max delay analysis). Similarly, the delay change is negative when victim and aggressors switch in opposite directions and it is used for early arrival time calculation (often referred to as min delay analysis). Nominal (stage) delay is a stage delay when aggressors are held quiet (logical 0 or 1).

FIG. 1 shows an example of the type of problem associated with aggressor alignment and delay measurement based on a predefined waveform crossing threshold. Waveform 102 is provided on a victim receiver input. Waveform 104 is provided on a victim receiver output. Waveforms 102 and 104 are noisy (i.e., impacted by aggressors). The receiver gate in this example is an inverter. The waveforms in the example are computed in Spice using an exhaustive sweep of alignment parameters on a victim net in a 0.13 micron industrial design. The worst-case delay pushout when measured at the 50% Vdd crossing is 724 ps (Typically, $V_{ref}$ is chosen as 50% Vdd, but sometimes, especially when skewed gates dominate, it is less than that). This can happen when a rising receiver input waveform 102 has a falling noise bump 106 that barely touches the threshold and then rises again. However, this bump on the receiver input waveform 102 causes almost no delay change in the receiver output waveform 104 where the transition has only a slight bump 108 at the end. The receiver, a CMOS gate, in essence acts as a low pass filter, thereby smoothing the signal. Thus, aggressor alignment based on a conventional delay metric (50% Vdd crossing) applied to the bumpy transition on the victim net is clearly too pessimistic. Measurement of transition time using a $V_{ref}$ crossing time of the non-monotonic waveform is non-robust and can lead to non-unique results.

Figure 15:
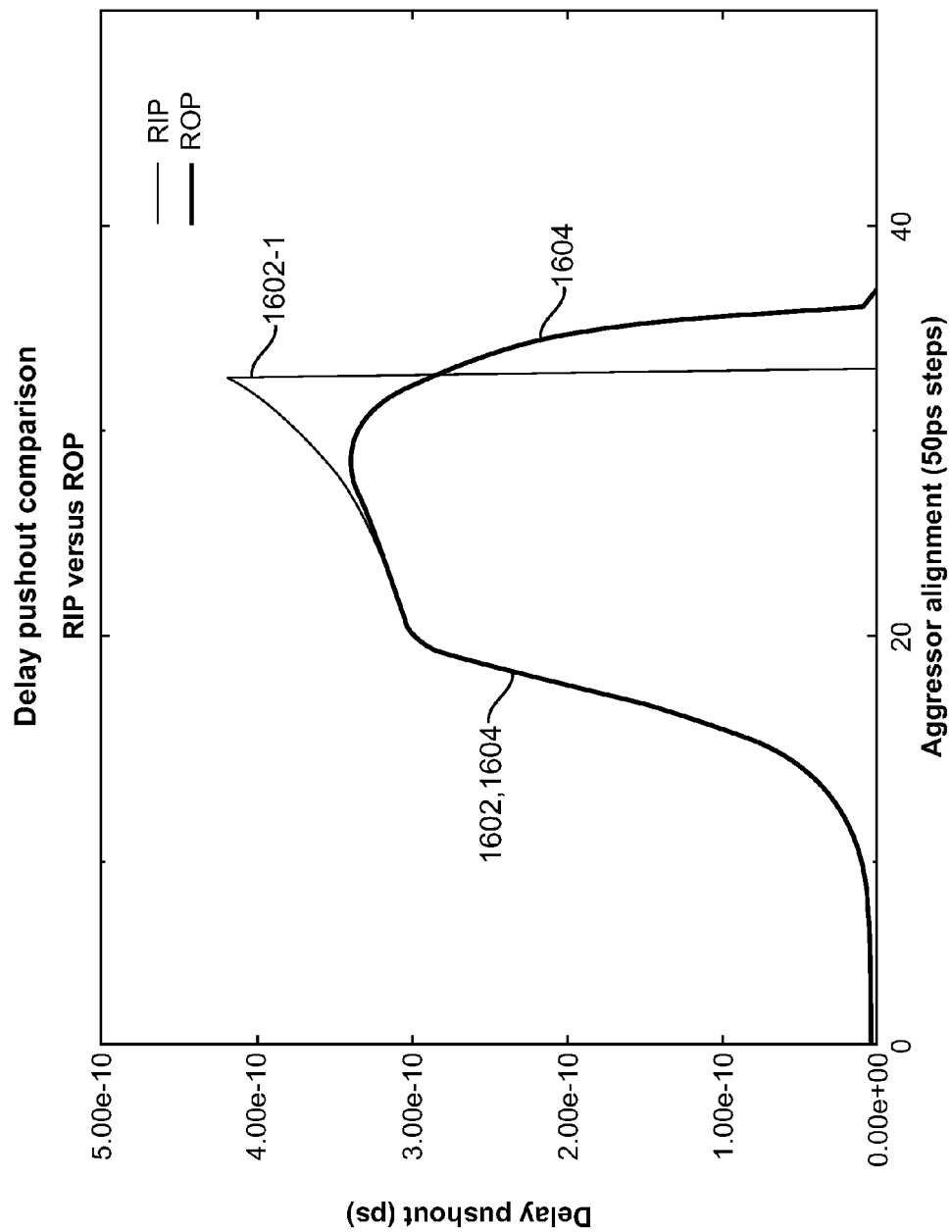
FIG. 15 shows two pushout delay measurements curve obtained from a series of Spice simulations with a single aggressor, which is aligned differently with respect to the victim transition in each simulation; one curve represents a prior technique involving receiver input measurement of $V_{ref}$ crossing, and another represents a technique in accordance with an embodiment of the invention involving receiver output measurement and optimized aggressor alignment.

FIG. 15 presents two curves showing delay pushout measurements that are obtained using a series of Spice simulations, where aggressor transition alignment is varied relative to the victim transition. Curve 1602 shows an example of delay pushout measurement using a prior Receiver Input Probe (RIP) technique and $V_{ref}$ crossing methodology. Note the cliff portion 1602-1. Curve 1604 represents a more robust pushout measurement using a Receiver Output Probe (ROP) technique and alignment optimization in accordance with an embodiment of the invention.

Stage with Victim Net and Aggressor Nets

Figure 2:
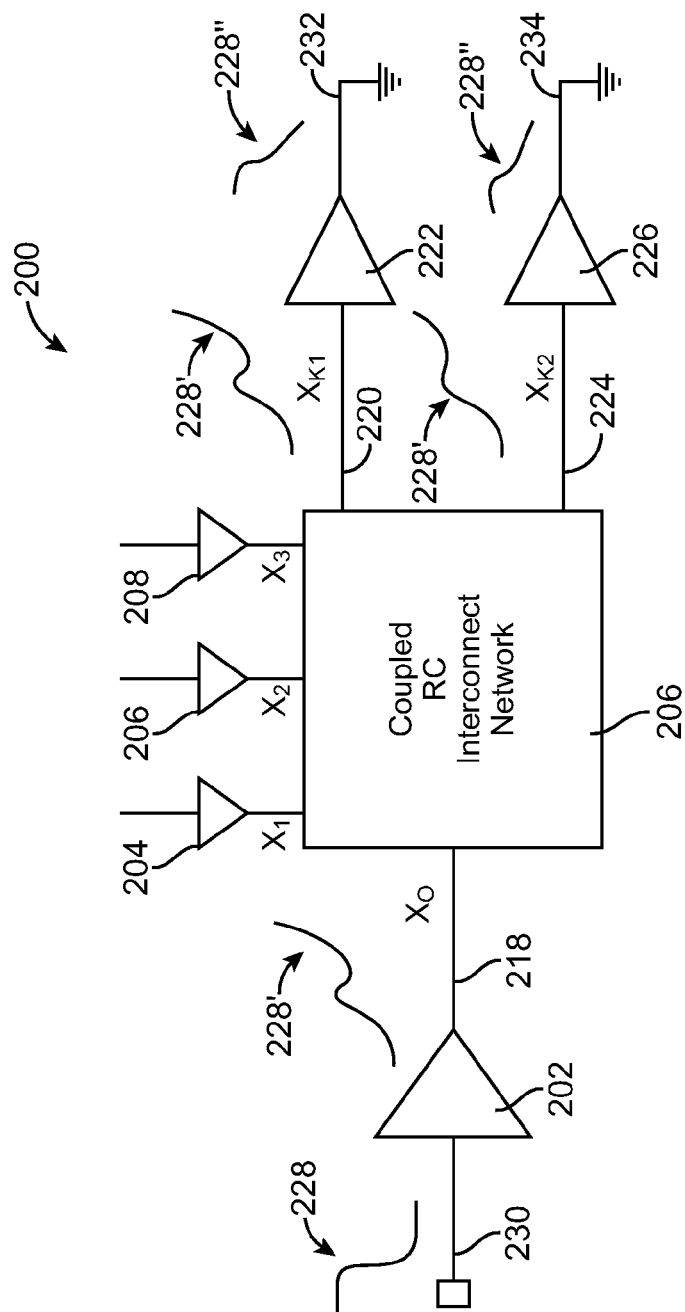
FIG. 2 is an illustrative simplified drawing of a stage showing an interconnect network that can be represented by a computational model and associated receivers in accordance with an embodiment of the invention.

FIG. 2 is a simplified drawing of a stage 200 driving first and second receivers 222, 226. The stage 200 includes a victim net driver 202 and aggressor net drivers 204-208. The stage 200 also includes an interconnect network 206, which is a network connecting victim net driver 202, aggressor net drivers 204-208 and receivers 222, 226. The victim net and aggressor net are said to be "coupled" to denote they are electrically connected through coupling capacitors. This is to distinguish resistively connected components of the circuit (connected by resistive wire). The stage 200 further includes a victim net driver output node 218 that connects the victim net driver 202 with the interconnect network 206. The stage also includes a first receiver input node 220 and a second receiver input node 224. The first receiver input node 220 connects the interconnect network 206 to the first receiver 222. The second receiver input node 224 connects the interconnect network 206 to the second receiver 226.

During circuit operation, the victim net driver 202 may propagate an input signal transition 228 from a victim net driver input node 230 to the victim net driver output node 218. The coupling between victim net and aggressor nets represented by interconnect network 206 makes it possible that aggressor net driver transitions on one or more aggressor nets can influence signal level on the victim net. Such aggressor-induced signal level changes, or aggressor crosstalk, can change the time required for a signal transition to propagate from victim net driver to a receiver connected to the victim net. Specifically, for example, crosstalk delay change on the victim net may ensue when the victim net driver 202 causes transitions on the victim net from one logic state to another during a time frame when one or more aggressor nets also transition from one logical state to another. If aggressor nets are switching in the opposite direction to that of victim net, crosstalk effects increases signal propagation delay from victim net driver output 218 to respective victim net receiver inputs 220, 224. Conversely, if victim and aggressor nets are switching in the same direction, crosstalk effects decreases signal delay. Thus, aggressor crosstalk delay change involves changes in victim net signal propagation time due to aggressor net switching.

In the illustrated example, the driver 202 has inverted the signal 228 to produce signal 228'. Also in this example, signal 228' is shown to be somewhat distorted due to the effects of aggressor nets upon the victim net. Usage of conventional delay measurement technique in the case of distorted signals can cause significant inaccuracy in terms of path delay. The ability to identify and propagate such a non-monotonic waveform of a transitioning signal during timing analysis of an electronic circuit design is one novel feature of the present invention.

The interconnect network 206 propagates the signal 228' from the victim net driver output node 218 to the first and second victim net receiver input nodes 220, 224. The first victim net receiver 222 propagates the signal 228' from the first victim net receiver input node 220 to a first victim net receiver output node 232. The second victim net receiver 226 propagates the signal 228' from the second victim net receiver input node 224 to a second victim net receiver output node 230. In this example, the receivers 222, 226 invert signal 228' so as to produce signals 228" Also in this example, signals 228" are shown to be somewhat smoothed due to low pass effects of receivers 222, 226.

Figure 3:
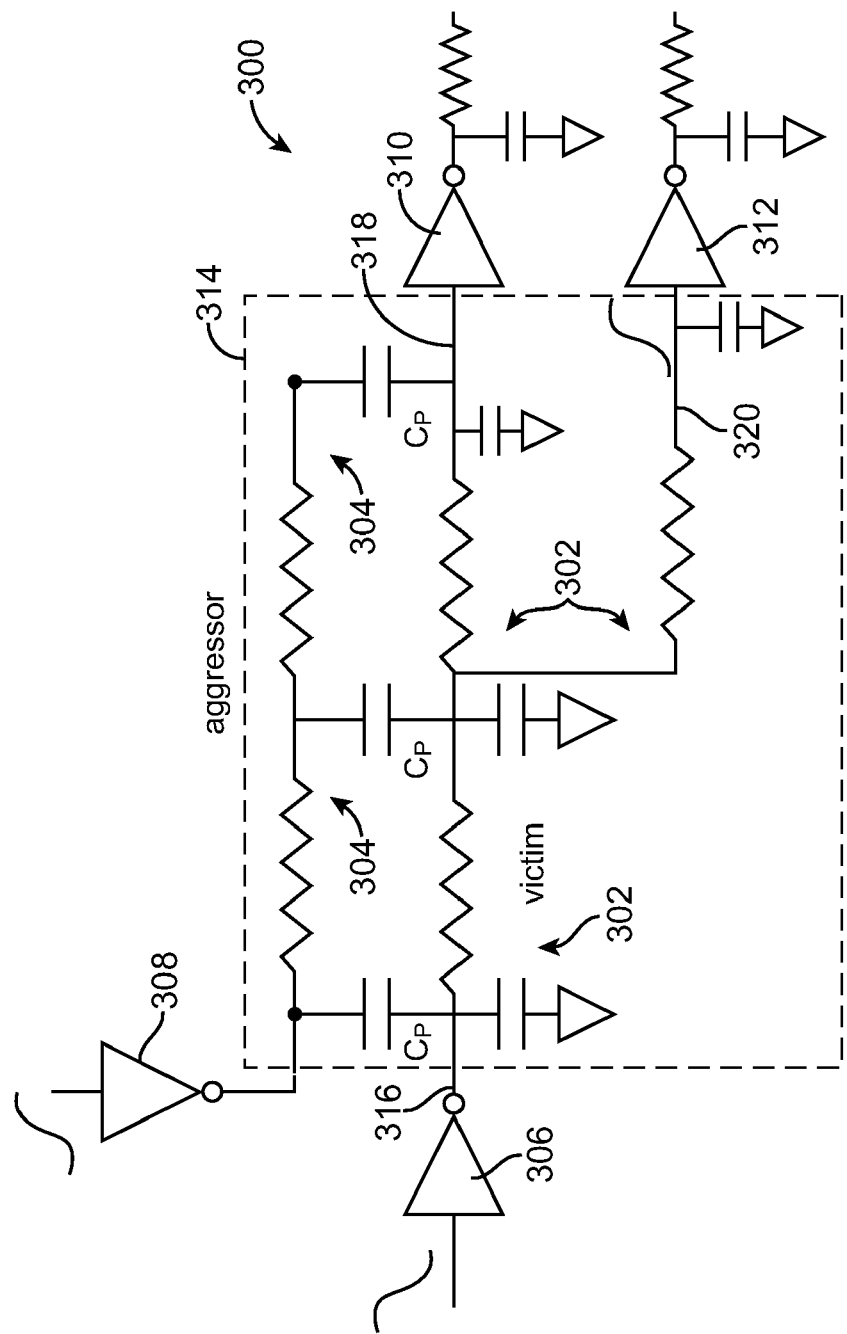
FIG. 3 is a more detailed illustrative simplified drawing of a stage showing capacitive coupling between a victim net and an aggressor net in accordance with an embodiment of the invention.

FIG. 3 is a more detailed illustrative drawing of a stage 300 that includes a victim net 302 and a single aggressor net 304. A victim net driver 306 is connected to drive the victim net 302. An aggressor net driver 308 is coupled to drive the aggressor net 304. Parasitic capacitances $C_P$ couple the victim and aggressor nets 302, 304. The victim net 302 is coupled to two receivers 310, 312. Dashed lines 314 enclose an interconnect network 314 comprising victim net 302 and aggressor net 304. In operation, signals are propagated through the interconnect network 314 from an output node 316 of victim net driver 306 to respective input nodes 318, 320 of receivers 310, 312. It will be appreciated that in order to avoid obscuring this disclosure in unnecessary detail, only a single aggressor net 304 is shown. In a typical stage, however, a victim net may be impacted by multiple aggressors, sometimes ten or more of them. Moreover, to simplify the description, the victim net 302 is shown to have only a single driver 306 and to be connected to only two receivers 310, 312, although an actual victim net may have several drivers and connections with more than two receivers.

The effect of a switching aggressor on a victim is proportional to the slew rate of transition of on the aggressor. In one embodiment, rising edge slew rate is defined as time required for a rising signal to transition from 20% of supply voltage (Vdd) to 80% of Vdd, and then divided by 0.6. Similarly, the falling edge slew rate is defined as time required for a falling signal to transition from 80% of Vdd to 20% of Vdd, and then divided by 0.6.

Indeed, effect of aggressor cross talk on victim's steady state or transition times is roughly proportional to signal transition rates on aggressors (slew rates), that in turn are proportional to effective load seen by the aggressors' drivers. That is, the slew rate on an aggressor depends on the strength of drivers holding the aggressor's neighbors (i.e., second-order aggressors). Crosstalk delay change is a result of switching neighboring nets (aggressors) upon switching transition time on the victim net. Due to the high ratio of coupling capacitance to ground capacitance of wires, it is important to account for second-order aggressors (aggressors of aggressors of a victim) when calculating crosstalk effects on the victim net. Neglecting (decoupling) the second-order aggressors effectively increases the load. Depending on the magnitude of the coupling capacitance between an aggressor and its aggressors, the error of slew rate due to such decoupling can be significant. Thus, it is important to account for second order aggressors when determining aggressor slew rate.

As used herein, a first order aggressor net is an aggressor net that has a significant crosstalk influence on a given victim net. A second order aggressor is an aggressor net that has significant influence upon a transition waveform (or slew rate) of a first order aggressor of the given victim net. It is possible that an aggressor net may serve as both a first order aggressor and a second order aggressor relative to a given victim net. The consideration of second order aggressor effects is a novel feature of the present invention that contributes to more accurate delay change analysis.

Pre-Computing Aggressor Waveforms

Figure 4:
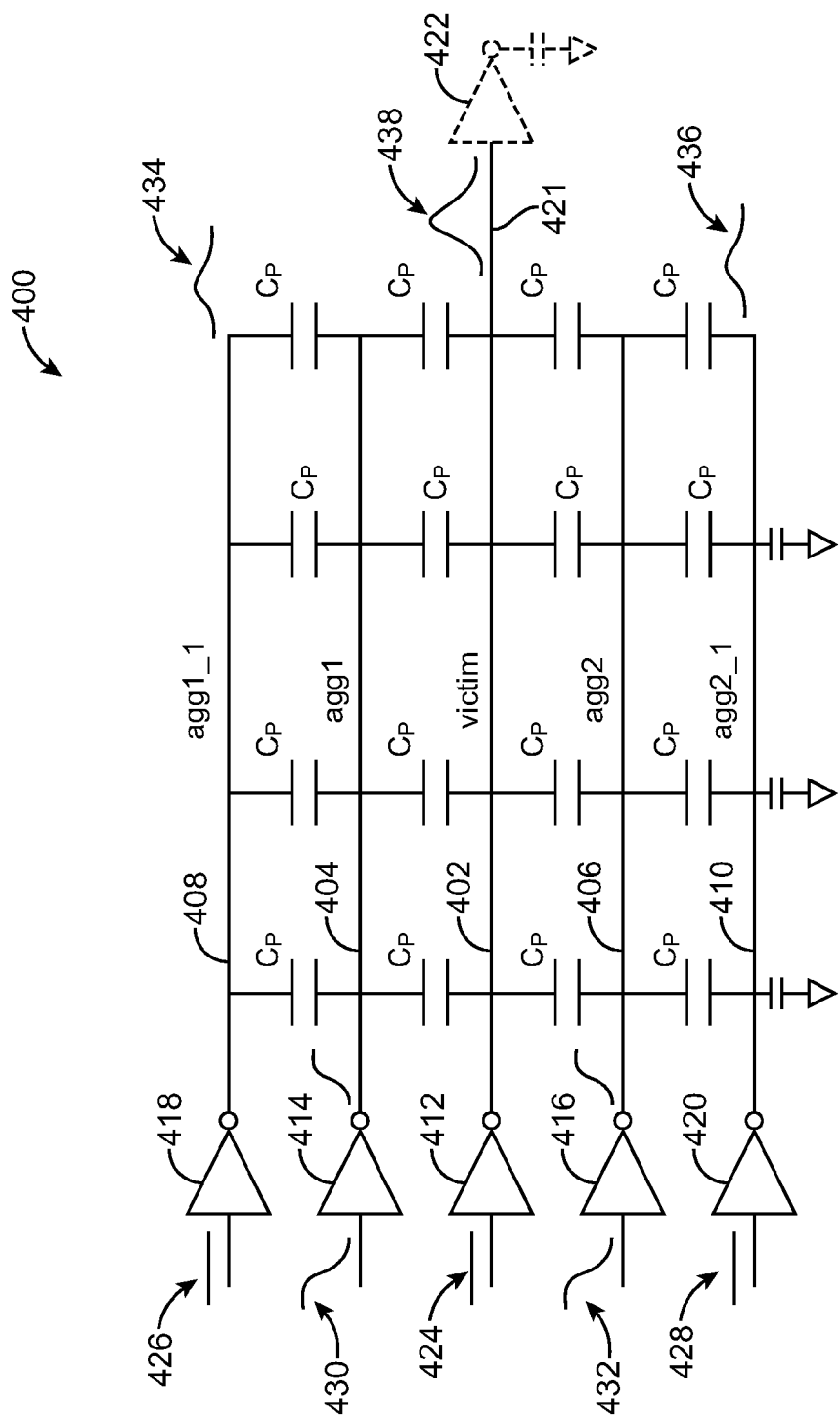
FIG. 4 is an illustrative simplified drawing of a stage which includes a victim net, two first order aggressor nets and two second order aggressor nets and which also illustrates potential impact of first order aggressor net switching upon the victim net and the second order aggressor nets in accordance with one embodiment of the invention.

FIG. 4 is an illustrative drawing of a stage 400, which includes a victim net 402, two first order (victim's nearest neighbor) aggressor nets 404 (agg1), 406 (agg2) and two second order (first order aggressors' nearest neighbors) aggressor nets 408 (agg1_1), 410 (agg2_1). Victim net driver 412 is connected to drive victim net 402. Respective aggressor net drivers 414-420 are respectively coupled to drive aggressor nets 404-410. The victim net 402 is connected to an input node 421 of receiver 422. The respective victim and aggressor nets are coupled as shown by parasitic capacitances Cp. Parasitic resistors are omitted from the figure for the sake of clarity.

FIG. 4 illustrates possible effect of transitions on the respective first order aggressor nets 404, 406 upon signal level on the victim net 402 and upon signal levels on the respective second order aggressor nets 408, 410. In this example, input signals to the victim and second order aggressor net drivers 412, 418, 420 are held constant 424, 426, 428 while input signals on first order aggressor net drivers 414, 416 are switched 430, 432. As a result of parasitic coupling capacitance $C_P$ between respective pairs of first and second order aggressors, respective signal fluctuations 434, 436 occur on each of the second order aggressor networks 408, 410, and victim net (which can be considered as an aggressor to aggressor nets). The fact that the second order aggressors and the victim net are present and are grounded through some finite holding resistance has a significant effect on the transition rate (slew rate) of transition on the aggressor nets.

It will be appreciated that the network of FIG. 4 is a significantly simplified relative to large and complex interconnect networks of some actual integrated circuit designs. A given victim net may have multiple first order aggressors. A given first order aggressor net may have multiple second order aggressor nets. It will be further understood that crosstalk delay change analysis through simulation of a large and complex interconnect network, especially one with nonlinear (models of) aggressor drivers, could be prohibitively expensive. One advantage of the present invention is that it can provide accurate crosstalk delay change analysis without the need for such simulation.

More particularly, in accordance with one novel aspect of an embodiment of the present invention, aggressor waveforms for fast transitions of aggressors are pre-computed on aggressor nets using only prescribed closest neighbors, victim and second order aggressors. The computation is performed using a (nonlinear) ViVo current model (CM) and Π-model of the load, which is computed for the network including aggressor nets and its neighbor nets. The CM and load model used in a present embodiment are described below with reference to FIGS. 6A-6B. As used herein, a fast transition of an aggressor is a rising or falling waveform of voltage transition on the output of an aggressor's driver or aggressor net, which is the fastest among possible sensitizations and drivers. Thus, if an aggressor net has multiple drivers with multiple sensitizations, the fast transition is computed using the combination of driver and sensitization that gives the fastest aggressor transition. The fastest aggressor transition is pre-computed because it is likely to be an aggressor to several victim nets, and calculating in advance gives significant run time improvement. In addition, during the computation of fast transition on aggressor nets the effects of neighbors nets are also accounted for, which effectively means that during a subsequent delay change calculation on a victim net, second order aggressors are also accounted for. In a present implementation, a piece-wise linear (PWL) aggressor waveform is used. The prescribed neighbors are nets having coupling capacitance to the aggressor net in which the fast transition is calculated.

During crosstalk delay change determinations in accordance with one embodiment of the invention, only first order aggressors of a victim net are considered. These aggressors' nonlinear drivers are replaced with pre-computed voltage sources (i.e., the pre-computed aggressor waveforms) determined during the fast transition analysis. The aggressor waveforms, however, are computed using (a model of) nonlinear driver of the aggressor net and accounting for the impact upon the aggressor from other nets closest to the aggressor net (that is, second-order aggressors of the victim under scrutiny).

Conversely, in the case of crosstalk delay change analysis, a transition on the victim net can impact transitions on aggressor nets. Just replacing the aggressor's driver with a voltage source would assume an infinite admittance of the switching aggressor driver and would neglect transition on the victim net impact upon aggressors. A Thevenin equivalent circuit is substituted for an aggressor driver in order to account for the finite admittance of the switching aggressor drivers.

Figure 5:
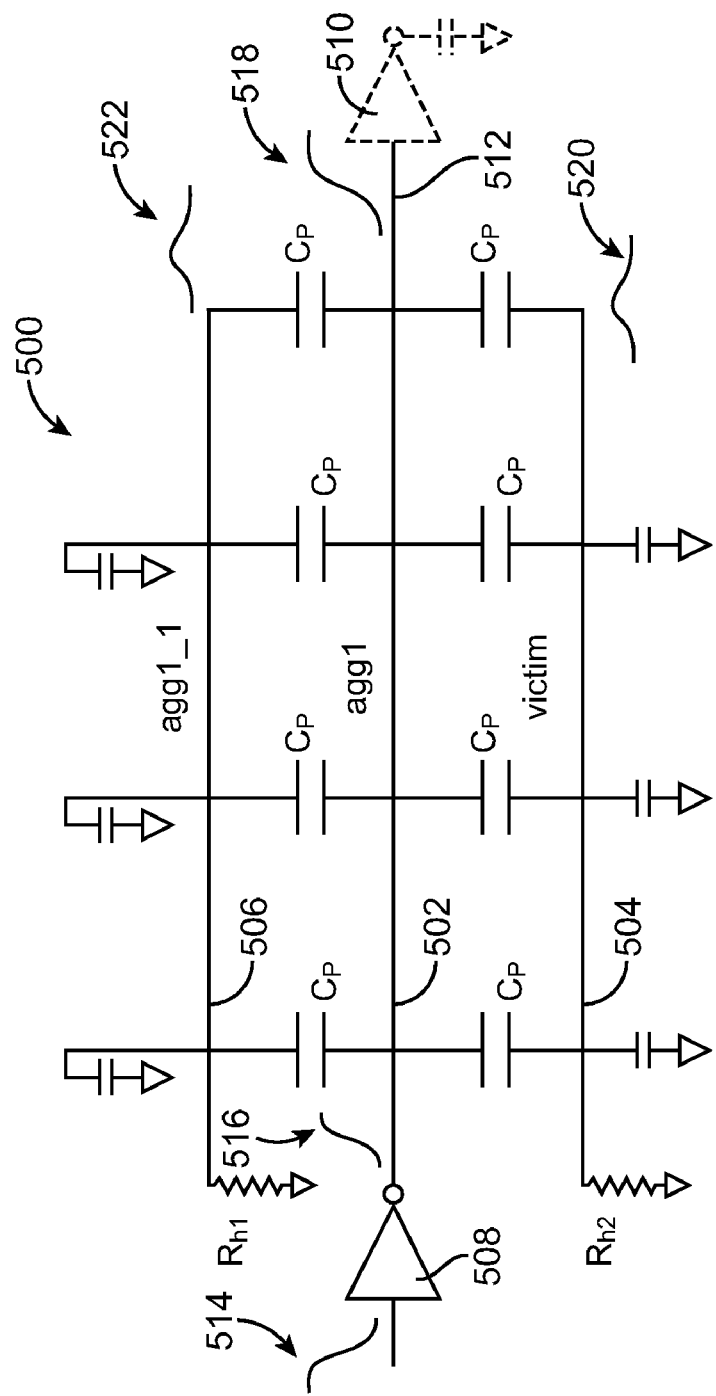
FIG. 5 is an illustrative simplified drawing of one example circuit that can be used in accordance with one embodiment of the invention to pre-compute fast transitions on aggressor nets.

FIG. 5 is an illustrative drawing of one example circuit 500 that can be used to pre-compute fast transitions on aggressor nets. Parasitic resistors are omitted from the figure for the sake of clarity. It will be appreciated that at some point in the course of performing timing delay analysis of an integrated circuit design, a given net may be a victim net and at other points it may be an aggressor net. Likewise, at some point in an overall delay change analysis process, a given net may be a first order aggressor and at another point it may be a second order aggressor net.

Accordingly, computation of fast transitions (rising and falling) on output pins of gates is done in a Breadth-First Search (BFS) traverse of the whole circuit. Through this traversal, it is ensured that the worst-case (WC) fast transition is pre-computed on all nets. The pre-computed fast transitions are used as a voltage source (waveform) replacing aggressor drivers during the crosstalk delay change analyses.

The circuit 500 of FIG. 5, is configured for calculation of fast transitions on first order aggressor net 502 (agg1). The neighbors of aggressor net 502 are victim net 504 and (victim) and second order aggressor net 506 (agg1_1). Parasitic capacitances $C_P$ couple aggressor net 502 to victim net 504 and couple aggressor net 502 to second order aggressor net 506. Nets (not shown) that are more remote from aggressor net 502 are assumed to have a minor impact of results and are thus decoupled. Aggressor net driver 508 is coupled to drive aggressor net 502. Respective drivers for victim net 504 and second order aggressor net 506 are replaced with respective resistances $R_{h2}$ and $R_{h1}$ that are connected to ground, and the receivers are replaced by ground capacitors to model their respective gate capacitance. The holding resistors are found from the cell library, and they approximate the weakest holding driver of the respective net.

It will be appreciated that the circuit 500 is configured to pre-compute a waveform associated with first order aggressor net 502 that has a potential crosstalk impact on victim net 504. The pre-computed waveform for first order aggressor 502 takes into account parasitic influences of both the victim net 504 and the second order aggressor 506. While only one second order aggressor 506 of the victim net shown in the example circuit 500 of FIG. 5, it will be appreciated that a given victim net may have multiple second order aggressors, and that its pre-computed waveform on all its first order aggressor nets will take these in to account as well.

In operation, a fast transition signal is driven by driver 508 onto aggressor net 502. More specifically, an input signal transition 514 is provided to an input of driver 508. A resulting driver output signal transaction 516 is propagated across net 502 and appears as signal transition 518 at an input of receiver 512, which may be used as the input wave when computing fast transition waveform on the next net, driven by driver 510.

The pre-computed fast transitions on aggressor nets of the design are used during the delay change computation on each victim net, which is described in following sections below.

Piece-Wise Linear Approximation of Pre-Computed Aggressor Waveforms

In a present embodiment, pre-computed fast transition waveforms (two for each aggressor net—rising and falling) are stored represented by time-value pairs, and approximating a smooth transition in a piece-wise linear (PWL) fashion. The more pieces used in the PWL wave, the more accurate the approximation is. In accordance with one aspect of the invention, a multiple piece PWL wave is used in delay change analysis to model transitions on the aggressors. The use of multi-piece PWL can significantly improve accuracy of the noise and change calculation. In accordance with another aspect of the invention, a method is provided to effectively compress the PWL waveform without significant loss of accuracy such that whole PWL wave will be stored using less memory—only 8 bytes of memory in one embodiment.

In general, a linear saturated ramp ordinarily is used by typical prior timing analysis tools to model a transition on an aggressor net. The ramp can be viewed as a PWL waveform consisting of only one piece, which physically describes an averaged slew rate of the transition. A ramp representation of real signal transition with only a one-piece PWL wave has been used in all timing tools for reasons such as the following. (1) accuracy of (linear) driver model generally has been too low to accurately capture details of a signal transition other then averaged slew rate; (2) the transition times typically were small compared to clock period of modern VLSI designs, such that a detailed description of transition was not especially important; and (3) storing a PWL wave ordinarily requires a relatively significant amount of memory, since 2 single-precision numbers usually are needed for each piece, which typically takes about 8 bytes of memory.

In contrast, a new methodology in accordance with one embodiment of the invention is based on generation, storage and usage of multi-piece PWL waveforms accurately approximating fast transitions on aggressor nets. As noted before, using a realistic waveform in the voltage source modeling aggressor transition is a significant factor in improving accuracy of delay change analysis compared to conventionally used linear ramp.

One advantage of the use of detailed (realistic) waveform is improved accuracy of analysis. However, storage of detailed wave an all pins of design may not be practical since it could require huge amount of memory.

In order for the method to be more practical, we suggest to compress the original waveform down to 8 bytes and store such compressed wave on a pin of a design. When the wave is needed for analysis, it is decompressed to its normal size. The method of compression and de-compression ensure minimal loss of accuracy while capturing all crucial data of the original waveform, which is computed from simplified circuit of the stage containing Vivo current model and Π-load.

Figure 9:
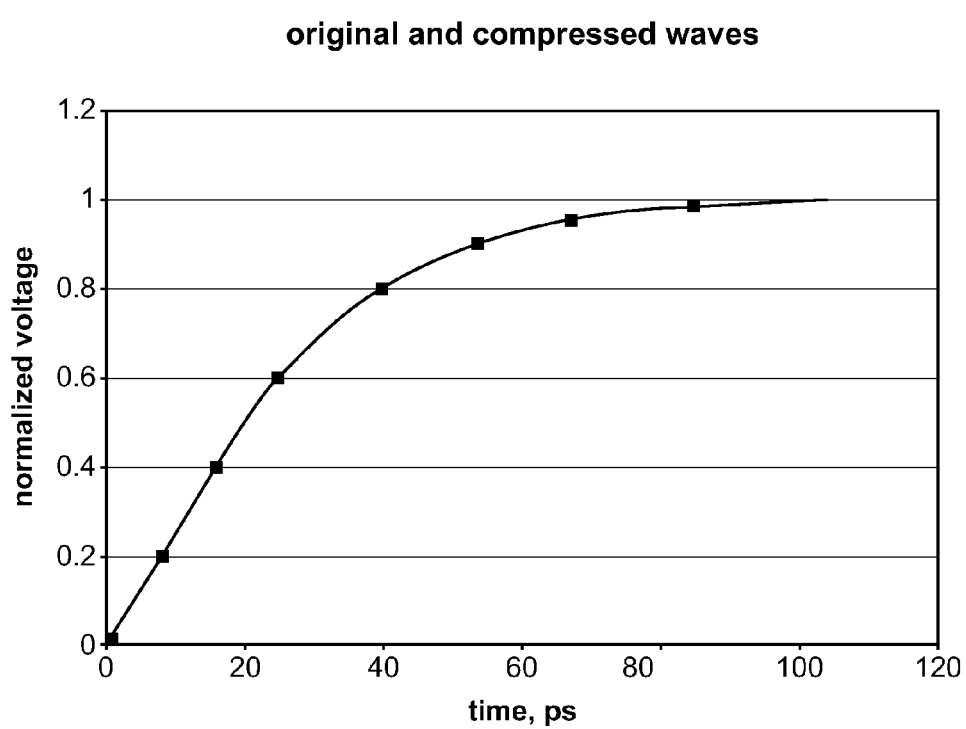
FIG. 9 is an example of an original aggressor waveform that is to be compressed using piece-wise linear (PWL) in accordance with a present embodiment of the invention. The markers denote segments that are stored in the compressed representation of the waveform

FIG. 9 is an example of an original aggressor waveform that is to be compressed using PWL in accordance with a present embodiment of the invention.

A compression algorithm in accordance with a present embodiment comprises the following steps:

1) Identification of time points where the original wave crosses the following predefined voltage values: {0.02, 0.2, 0.4, 0.6, 0.8, 0.9, 0.95, 0.98}. These voltage values are specified in the normalized manner, meaning that $V_{DD}$ is taken to be 1. Correspondent time points are denoted by $t_j$, j=0, 1, ... 7.

2) The 8 time points are used to compute 7 time segments $R_j$. Each time segment corresponds to a "piece" of the aggressor waveform. The seven segments $R_j$ are defined as:

$R_1=t_1-t_0$,
$R_2=t_2-t_1$,
$R_3=t_3-t_2$,
$R_4=t_4-t_1$,
$R_5=t_5-t_4$,
$R_6=t_6-t_5$,
$R_7=t_7-t_6$.

3) The numbers $R_j$, j=1, 2, 3, 5, 6, 7 are compressed by dividing by the $0.1*R_4$ and rounded to be stored 6 bytes (1 byte for each number). The slew $R_4$ is stored in 2 bytes, by multiplying by the factor 0.4e−12. Thus, $R_4$ is used to store the slew, and the other segments are correlated to the stored value of slew. It will be appreciated that the stored slew can vary from picoseconds to nanoseconds. Storing one slew value $R_4$ and correlating the other segments to it reduces the amount of storage required to represent an aggressor waveform using PWL. The slew is stored within 0.2 ps accuracy, which is far below the errors of analysis. The range of the slews that can be stored using the described method vary from 0.4 ps to 64 ns.

Interconnect Network Reduction and
Pre-Computation of Aggressor-Induced Victim Net
Waveforms Referring to FIGS. 2-3, a respective interconnect network 206, 314 is reduced so as to produce a computational model in the form of transfer functions $H_{jk}(s)$, $Y_{jk}(s)$ from all ports (driver outputs) to all ports and taps (receiver inputs), where j enumerates driver output pins (referred to as ports) and k enumerates receiver input pins (taps). A reduction is performed for a victim net subjected to crosstalk analysis. One enhanced reduction technique that may be employed in accordance with an embodiment of the invention is described by, A. Odabasioglu, M. Celik and L. Pileggi, "PRIMA: Passive reduced-order interconnect macromodeling algorithm," *IEEE Transactions on Computer Aided Design of Circuits and Systems*, vol. 18, no. 8, pp. 645-654, August 1998, which is expressly incorporated herein by this reference. However, there are many reduction techniques including AWE, PRIMA, PVL, PACT and Arnoldi that are suitable for computing H and Y matrices. See P. D. Gross et al.

In general, an interconnect network of a given stage can be represented by computational model comprising an H-parameter matrix and a Y-parameter matrix. The H-parameter matrix represents a transfer function, which is used to relate the voltage at each driver port to the voltage at a receiver input of interest. Such computational model can be used to compute aggressor-induced victim net waveforms from the pre-computed aggressor waveforms.

In one embodiment, both aggressor and victim driver output voltages are propagated to receivers using respective H-parameter matrix elements (transfer functions). The Y-parameter matrix is an admittance matrix used to relate voltage on one port to current on another port (off-diagonal elements of the Y-parameter matrix). In a present embodiment of the invention, the admittance matrix is used to compute aggressor-induced current on a victim net driver port and an aggressor-induced voltage on a selected receiver input port as related to a pre-computed voltage on an aggressor net driver port. One example of a general type of technique that can be used to determine aggressor-induced victim net driver output node current and aggressor-induced victim net receiver input node voltage based upon pre-computed aggressor waveforms and a reduced network is disclosed by, Vivek Raghavan, J. Eric Bracken and Ronald A. Rohrer, "AWESpice: A General Tool for the Accurate and Efficient Simulation of Interconnect Problems," 29th ACM/IEEE Design Automation Conference, 1992, P. 87-92, which is expressly incorporated herein by this reference.

Figure 16:
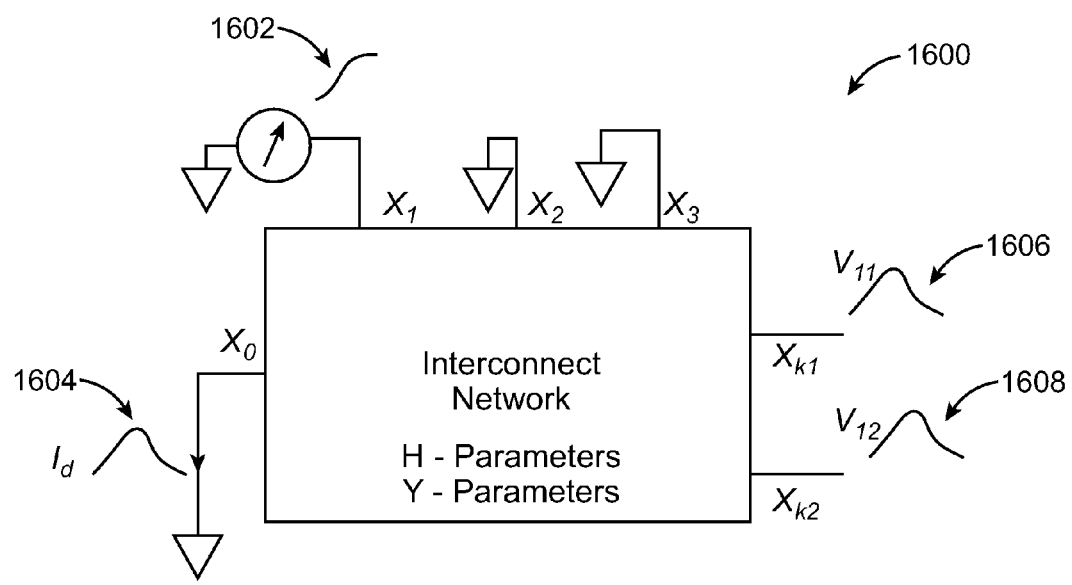
FIG. 16 is an illustrative drawing of the stage of FIG. 2, with one aggressor driver replaced by a pre-computed aggressor waveform for use in computation of a corresponding victim net aggressor-induced current waveform and to compute corresponding victim net aggressor-induced voltage waveforms.

FIG. 16 is an illustrative block diagram drawing of a stage represented by a reduced interconnect network 1600 coupled to a pre-computed aggressor waveform 1602 for use in computation of a corresponding victim net aggressor-induced current waveform 1604 and to compute corresponding aggressor-induced voltage waveforms 1606, 1608, which are responses to the pre-computed aggressor net waveform attached instead of the respective aggressor driver. More specifically, node $X_0$ represents victim net driver output node. Respective nodes $X_1$, $X_2$ and $X_3$ represent respective capacitively coupled aggressor nets. Respective nodes $X_{k1}$ and $X_{k2}$ represent respective victim receiver input nodes.

In the example shown in FIG. 16, the nodes of the interconnect network 1600 are coupled to determine an aggressor-induced victim current waveform and to determine an aggressor-induced victim voltage waveform, which are induced by an aggressor net waveform on node $X_1$. Specifically, node $X_1$ is coupled to receive pre-computed aggressor waveform 1502 capacitively coupled through node $X_1$. Each of nodes $X_2$ and $X_3$ are connected to ground. The pre-computed aggressor waveform connected at node $X_1$ is represented as a PWL as described above.

The computational model for the reduced interconnect network is used to determine an aggressor-induced victim net current waveform 1604 and aggressor-induced victim net voltage waveforms 1606, 1608 for each of aggressors denoted by $X_1$, $X_2$ and $X_3$. FIG. 16 illustrates a methodology to compute victim net aggressor-induced waveforms from a pre-computed aggressor waveform node $X_1$. More particularly, the computational model is used to compute an aggressor-induced victim net current waveform on victim net driver output node $X_0$, which is induced by the aggressor waveform coupled through node $X_1$ and denoted below by $I_{0,1}(t)$. Likewise, the computational model is used to compute aggressor-induced victim net voltage waveforms on receiver input nodes $X_{k1}$ and $X_{k2}$, which are induced by the aggressor waveform coupled through node $X_1$ and are denoted, respectively, by $V_{1,k1}(t)$, $V_{1,k2}(t)$. In a similar manner, the computational model is used to determine aggressor-induced current and voltage waveforms, which are induced by aggressor waveforms coupled to nodes $X_2$ and $X_3$.

In one embodiment, the use of a computational model to determine aggressor-induced victim current waveforms is described below with reference to equation (6), and the use of a computational model to determine aggressor-induced victim voltage waveforms is described below with reference to equation (7).

The aggressor-induced victim net current and voltage waveforms are stored in a computer readable storage medium in PWL form. Moreover, these aggressor-induced victim net waveforms can be represented with far more pieces than the pre-computed aggressor net waveforms. A very large number of aggressor net waveforms are pre-computed, and these are approximated by a PWL waveform with a lesser number of pieces because of the large amount of memory storage that would be required to store more detailed waveforms. However, aggressor-induced victim net waveforms are computed on a stage-by-stage basis as the delay computation process steps through a design. Therefore, only a relatively few aggressor-induced victim net waveforms need be stored at any given time. Consequently, these waveforms can be stored with higher precision, meaning a larger number of pieces in their PWL waveform representations.

The stored aggressor-induced victim net current and voltage waveforms have a sufficient amount of detail to identify the waveform peaks or troughs. In other words, the waveforms have sufficient detail to identify the point in a given aggressor-induced waveform that is likely to have the greatest potential to speed or to slow a corresponding victim net signal transition. As explained more fully below, these high impact portions (peaks or troughs) of aggressor-induced victim net current and voltage waveforms can be aligned with prescribed portions of a victim net signal transition to identify aggressor alignments that have the most significant impact upon victim net signal transition delay. In one embodiment, aggressor-induced victim waveform peaks (or troughs) are aligned with a prescribed victim signal transition time (e.g., $J_{50}$) during signal delay change analysis.

Current Model with Π-Load

Figure 6A:
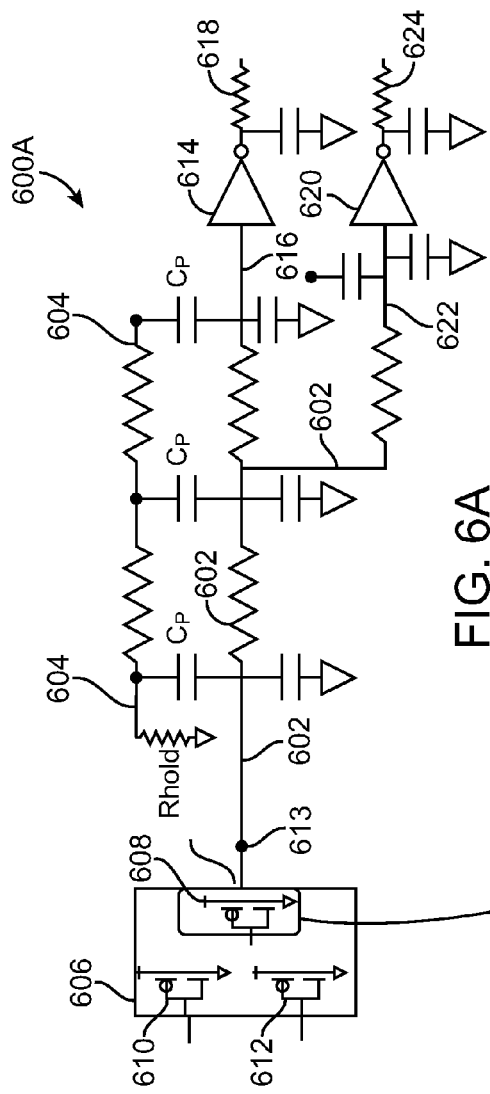
FIGS. 6A-6B are illustrative drawings that show, conceptually, the conversion of a stage in a design to a simpler circuit suitable for crosstalk analysis in accordance with an embodiment of the invention.
Figure 6B:
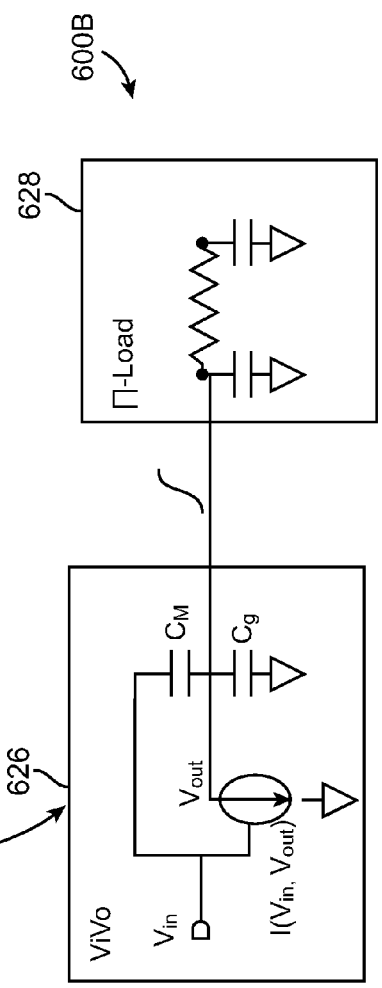

FIGS. 6A-6B are illustrative drawings to show, conceptually, the conversion of a stage in a design to a simpler circuit suitable for crosstalk analysis in accordance with an embodiment of the invention. FIG. 7 is a two-dimensional (2D) current table representing the non-linear ViVo current model 626 of a real driver 608 of FIG. 6A. In accordance with one inventive aspect, original stage 600A is converted to a simplified stage represented as a current model stage 600B. Stage 600A includes a victim net 602 and aggressor net 604. The victim and aggressor nets are coupled through parasitic capacitances Cp. Victim net driver 606 is connected to the victim net 602 at node 613. In this example, the victim driver 606 includes multiple internal components 608-612. Each internal component 608, 610 and 612 is a channel-connected component (CCC), each including transistors connected to each other by their drains or sources. Such partition of a circuit into CCCs allows more efficient analysis used during static timing and noise analyses because a driven CCC, 608, has negligible impact on noise or delay on its respective driving CCC, 610, 612. The aggressor net 604 is grounded using a holding resistance $R_h$. The holding resistance is pre-characterized for each gate and both logical stages and stored in a cell library, such as .cdB library used by a noise analysis tool such as CeltIC produced by Cadence Design Systems, San Jose, Calif. The holding resistance can be computed (during the library characterization stage) using Spice circuit simulator. A first receiver 614 has a first receiver input 616 and a first receiver output 618. A second receiver 620 has a second receiver input 622 and a second receiver output 624.

In a present embodiment, on each net a calculation of transitions is performed per victim driver and for all arcs over its last channel-connected component (CCC). As explained above, a stage is defined as a subcircuit of the design comprising a victim net, its aggressor nets, and their corresponding drivers. In a present implementation of the invention, a driver is defined as the last CCC of a driving cell. A practical assumption often used in industry is that for a multi-CCC cell, effects of crosstalk on cell internal delay, defined as a delay from an input to the cell to an input to the last CCC, can be neglected. Since the present embodiment is devoted to computation of delay change on a stage due to crosstalk, it considers only the last CCC of the driving cell. All single-CCC cells (e.g. inverter or NAND) are drivers by definition.

Simplified stage 600B includes a current model 626 of the CCC 608 of driver 606. Simplified stage 606B also includes a Π-load model 628 of the load at the output 613 of the driver 608 which approximates the full load as seen by the driver. In a one implementation, a precharacterized nonlinear current model (CM) is used to model the current drawn from the driver. In a present embodiment of the invention, each cell (e.g., driver, driver component) in a design cell library has a set of corresponding CM's. The Π-load is computed from the driving-point admittance of the victim net 602 driver output 613 on an interconnect network, which has been reduced as described above, with all the net 602 aggressors grounded using the largest holding resistance ($R_h$) modeling the weakest strength of their corresponding drivers. More specifically, a Π-model of the load, described by the triplet $\{R, C_1, C_2\}$ is computed through matching its 3 moments to those of the driver-point admittance, Y(s), of the reduced macro-model. The moments are computed and matched at some complex frequency, $s_0$, which in one embodiment is zero, and in another could be related to an estimated (or passed from the timing analysis tool) slew rate, T, on the victim net as $s_0=1/T$.

The ViVo model of FIG. 6A is employed as the nonlinear current model 626 in the embodiment of FIG. 6A. ViVo models current response of the last CCC, such as component 608 of FIG. 6A, of a driver 606 to voltages on input and output. The ViVo model is pre-characterized and stored in a cell library per each transition type (rise/fall) and per each input-output arc of each interface CCC of the cell, that is a CCC connected to either input or output pin of the cell CCC. ViVo models current drawn by the output pin of the CCC for various voltage values on the input and output pins. This current model is part of an embodiment of the invention that allows high accuracy of analysis due to the fact that a current drawn by a gate during switching can be well represented by a voltage-controlled current source, which is a function of instantaneous voltages on the input and output: $I_d=I(V_i, V_o)$. It is implemented as a two dimensional (2-D) current table, discussed below, describing the nonlinear (voltage-controlled) current source. In addition to the 2-D current table shown in FIG. 6B, the ViVo CM also includes two capacitors modeling, respectively, the Miller $C_M$ and ground $C_g$ capacitance of the output pin of the output of the CCC, shown in FIG. 6A.

Since the ViVo current table is a function of instantaneous voltages on input and output and not dependent on transition history, its generation can be done through a series of DC simulations in Spice and can be very fast. The capacitances $C_M$ and $C_g$ are obtained in one embodiment as a sum of parasitic capacitances of devices in the gate. In another embodiment they can be computed using transient simulation in Spice. In a present embodiment, sensitization for DC simulations is determined from a logic function extracted from the CCC using binary-decision diagrams (BDD). Each DC simulation is performed for a pair of constant voltages on input/output pins, and generates an entry in the 2-D current table. In a present implementation, as a part of the characterization carried out for multi-CCC cells additional to the ViVo CM, the slew is characterized for the last CCC's inputs as a function of slews on the cell's inputs.

A vertical axis of the 2-D table lists $V_{in}$ values $V_{i0}$ to $V_{iM}$. A horizontal axis of the 2-D table lists $V_{out}$ values $V_{o0}$ to $V_{oN}$. Entries in the table are current values associated with voltage value pairs ($V_{in}$, $V_{out}$). For instance, current value $I_{22}$ is associated with the pair ($V_{i2}$, $V_{o2}$), and $I_{M2}$ is associated with the pair ($V_{iM}$, $V_{o2}$). Conversely, a $V_{out}$ value is associated with a ($V_{in}$, current value) pair. For example, $V_{out} = V_{o2}$ is associated with the pair, ($V_{iM}$, $I_{M2}$).

Therefore, the ViVo model advantageously can be used to assess the impact of aggressor induced victim current upon driver output node voltage $V_{out}$ in a victim net. More particularly, the value of an output voltage $V_{out}$ of a ViVo model of a CCC depends upon a combination of a value of an input voltage $V_{in}$ provided to the ViVo model and a value of current drawn through the ViVo model. As explained more fully below, pre-computed aggressor waveforms are used during crosstalk analysis to produce a composite aggressor induced current in the victim net. The composite aggressor induced current is the sum of aggressor induced currents from all aggressor nets. In the simplified drawing of FIG. 6A, only one aggressor net 604 is shown. However, a given victim net in a real IC design may have multiple aggressor nets, each capable of inducing a current on the victim net. Aggressor induced current in a victim net contributes to the current drawn by the ViVo model. Specifically, the aggressor induced current in a victim net contributes to the current drawn by the driver (model) defined by the table as $I(V_{in}, V_{out})$ and the current drawn by the load represented by the PI-load model. The Kirchhoff current law (KCL) is then used to determine output voltage $V_{out}$ of the ViVo model in an iterative numerical procedure. Thus, as explained more fully below, a current model of a victim net driver can be used to calculate a voltage transition on the driver (model) output and therefore to assess delay change due to crosstalk.

Delay Change Calculation

An overall delay change calculation process in accordance with one embodiment for determining victim net signal delay change caused by aggressor induced crosstalk will be discussed next. By way of overview, pre-computed aggressor waveforms are used to determine aggressor induced current in a victim net. The aggressor-induced current, together with a current model (CM) of a (selected) victim net driver with a Π-load which is determined from a perspective of the driver output, is used to determine the driver output voltage $V_{out}$ of the selected victim net driver. A computational model of interconnect involving a transfer function H(s), determined for an interconnect network comprising the victim net and its aggressor nets, is used to propagate a determined victim driver output voltage $V_{out}$ signal to a (selected) receiver input. The pre-computed aggressor waveforms are used to determine aggressor induced current and voltage responses at, respectively, driver output and the receiver inputs using the computational model of the interconnect involving the functions H(s), Y(s), as shown in FIG. 16. An overall receiver input voltage waveform is determined based upon the aggressor induced victim receiver input voltage plus the voltage waveform propagated to the receiver input based upon the driver output voltage waveform. A current model of the (selected) receiver is used to propagate an overall receiver input voltage signal to the receiver output based upon the overall voltage at the receiver input. Crosstalk delay change is determined based upon two waveforms (noisy and noiseless) calculated at the receiver output.

Referring to FIG. 2, vector of voltages are denoted on all nodes by X, such that $X_0, X_1, \ldots, X_N$ denote voltages on nodes connected, respectively, to the victim and aggressor drivers, where N is the number of aggressors. We also denote the stage output voltages (on nodes connected to receivers) by $X_{N+1}, \ldots, X_{N+M}$, where M is number of receivers.

In the following more detailed explanation, victim and aggressor nets are assumed to each have a single driver. However, the case of multiple drivers on an aggressor net is handled similarly, and in the case of multiple drivers on the victim net, the described flow is repeated for each driver iteratively.

The following discussion defines the crosstalk delay change for an example situation in which there is a maxrise transition on a victim net denoting late rising transition. The three other types of transitions (maxfall, minrise and minfall) that are propagated through a design during static timing analysis (STA) can be defined similarly. Maxrise and minrise transitions on a victim denote transitions in which the output of the victim driver transitions from 20% of Vdd to 80% of Vdd are latest and earliest possible, respectively. Maxfall and minfall transitions on a victim driver denote transitions in which the output of the victim driver from 80% Vdd to 20% Vdd is latest and earliest possible, respectively.

First, let J[V(t)] denote a function over a space of rising or falling transitions. The value J is used as a transition time metric which associates a number (transition time) to a transition waveform. The conventional transition time metric, denoted by $J_{ref}$ is defined as the time when transition crosses $V_{ref}$ (typically 50% Vdd).

The maxrise nominal output transition, $\overline{X}_j(t)$ is defined as a rising transition occurring on j-th output of the stage (on an input of j-th receiver) caused by a late transition on one of the stage's inputs and with all aggressors being "quiet". Similarly, the maxrise noisy transition, $\tilde{X}_j(t)$ is defined as a rising transition with the aggressors undergoing falling transitions.

The maxrise crosstalk delay change on the j-th stage's output is defined as the difference in transition times as measured using some transition time functional J on noisy and nominal transitions on the stage's output caused by the same (late or early) transition on one of the stage's inputs:

$$D = J[\tilde{X}_j(t)] - J[\overline{X}_j(t)] \quad (1)$$

Transitions on the victim and aggressor nets can occur within corresponding switching windows (separately for rising and falling transitions) calculated during STA and specified relative to some (possibly different) clocks. Let $W_k$, k=0, ..., N denote switching windows (SW) on the victim and aggressor nets. It is assumed in this example that the SW's of the aggressor nets belong to the same clock domain as SW for the victim net. If clocks of an aggressor and the victim net are asynchronous, the aggressor's switching windows can be set to be infinitely wide. In this example, it is assumed that a SW is a range $W_k=[\tau_{ek}, \tau_{lk}]$, with the boundaries $\tau_{ek}, \tau_{lk}$ being, respectively, the earliest and latest possible transition times as determined during STA on k-th aggressor.

An alignment vector is defined as the vector of transition times of the aggressor transitions, $\tau=\{\tau_1, \ldots, \tau_N\}$.

Thus, the problem of calculation of the WC crosstalk maxrise delay change can be formulated as determining the maximal delay change between given input and output of the stage in the presence of aggressors undergoing falling transitions, each occurring within the correspondent switching window: $\tau \in W$, where W is an N-dimensional cube spanning the switching windows. The crosstalk delay change for the other three transition types can be defined similarly.

More specifically, crosstalk delay change calculation in accordance with one embodiment is part of the outer timing window iteration loop which includes calculation of the noiseless stage delay, crosstalk delay change and STA. At each such iteration the delay change calculation uses the switching windows computed in STA during the previous iteration and therefore can be viewed as independent for each stage.

The following describes the method of delay change calculation for one such stage. Consider Modified Nodal Analysis formulation for the stage:

$$C\dot{X}+GX=I, \quad (2)$$

Here C, G are capacitance and conductance matrices respectively, and the term in the right-hand side of Eq. (2) is a vector of currents drawn by the drivers:

$$I=\{I_0(t,X_0), \ldots, I_N(t,X_N), 0, \ldots\}^T \quad (3)$$

A discussion of Modified Nodal Analysis is provided in, M. Celik, L. Pileggi, A. Odabasioglu, IC Interconnect Analysis, Kluwer, 2002.

The proposed methodology assumes that the analysis is done in a topological order and, therefore the transition waveforms on inputs of all drivers are known voltage functions of time. Since the nonlinear driver is modeled by a current model, which related current drawn by the driver to input and output voltage waveforms, the current drawn by the driver can be viewed as a function of time and voltage on the driver output.

A Krylov subspace method applied to an interconnect network to compute the Y-parameter and H-parameter matrices:

$$Y_{k,0}(s), H_{j,k}(s), k=0, \ldots, N, j=1, M,$$

where N is number of aggressors and M is number of receivers. See A. Odabasioglu, et al.

A Π-load is computed, as described above with reference to FIGS. 6A-6B, by matching the first 3 moments with the driving-point admittance $Y_{0,0}(s)$ at some frequency $s_0$. The driver-output response is efficiently computed numerically on the small circuit consisting of CM for the victim's driver (for a particular arc) and a Π-load.

After a nominal (noiseless) transition is computed, it is propagated to receivers using the transfer functions which can be written in the time domain as, $$X_{N+k}(t)=L^{-1}[H_{k,o}X_0(s)], \quad (4)$$

where $\chi_o(s)=L[\chi_o(t)]$ and $L[\bullet]$ denotes the Laplace transform.

The disclosed methodology is based on the pre-computed two fast transitions (rising and falling) waveforms on each net of design that can be aggressors to other nets. The two aggressor waveform calculations are performed (one for rising and one for falling transitions) using a simplified circuit model consisting of the CM for the net's driver and a Π-load. The computation is performed for all arcs across each driver of the net (if more than one), and the fastest one is stored to make further analyses conservative. The Π-load is computed from the driving-point admittance of the each driver of the net with all the net's aggressors included and their respective drivers replaced with the largest holding resistance modeling the weakest strength of the corresponding drivers. The computed fastest transitions are compressed and stored, along with the Π-load of each driver of each net for later usage.

The precomputed fastest transitions on its aggressors are used during crosstalk delay change calculation performed on each victim net of the design We call this fastest transition on k-th aggressor of a victim net "fast transition" and denote it by $X_k^*(t)$.

First, the nominal (noiseless) transitions are computed on the victim net driver output using the Π-load computed from the driving-point admittance of the victim net's driver on the interconnect with all the victim net's aggressors grounded using the largest holding resistance modeling the weakest strength of their corresponding drivers. The victim driver output nominal transitions are then propagated to all victim net receiver inputs using the transfer functions $H_{0,j}(s)$, and then to the corresponding receivers outputs using their respective CMs and Π-loads. The Π-loads for all receivers were stored at the earlier stage of the flow during fastest transition calculation on all aggressor nets of the design and therefore do not need to be re-calculated.

In case of the noisy transition on the victim, i.e. when the aggressor nets are switching, the aggressor drivers cannot be linearized. Hence, the aggressor waveforms pre-calculated using their correspondent non-linear drivers as described above, are used to model aggressor transitions. A transition on each aggressor driver output is computed once, stored and then re-used during delay change calculation on all its victims. More particularly, nominal transitions on aggressors, used to compute noisy transitions on the victim, are computed in advance as explained above, in a separate traversal of the design. It will be appreciated that the basic the method used to compute nominal aggressor net transitions is the same as that used to calculate nominal transition on the victim net.

Replacing the aggressors drivers with pre-computed aggressor waveforms representing voltage sources $X_k^*(t)$, $k=1, \ldots, N$ and using a reduced-order model of the interconnect the Kirchhoff Current Law for the victim's driver output in the time-domain can be expressed as:

$$I_o(t, X_o(t)) - L^{-1}\{Y_{o,o}L[X_o(t)]\} = \sum_{k=1}^{N} I_{o,k}(t-\tau_k). \quad (5)$$

Here $I_0=I_0(t, X_0(t))$ is the current drawn by the victim driver and $I_{0,k}$ denote aggressor-induced current responses on the victim driver output caused by the pre-computed fast transition on k-th aggressor:

$$I_{o,k}(t)=L^{-1}\{Y_{o,k}L[X_k^*(t)]\}. \quad (6)$$

Since the noisy transition is a function of the alignment vector τ, each current response $I_{o,k}$ needs to be shifted in time according to the alignment of the corresponding aggressor transition, $τ_k$.

Figure 8:
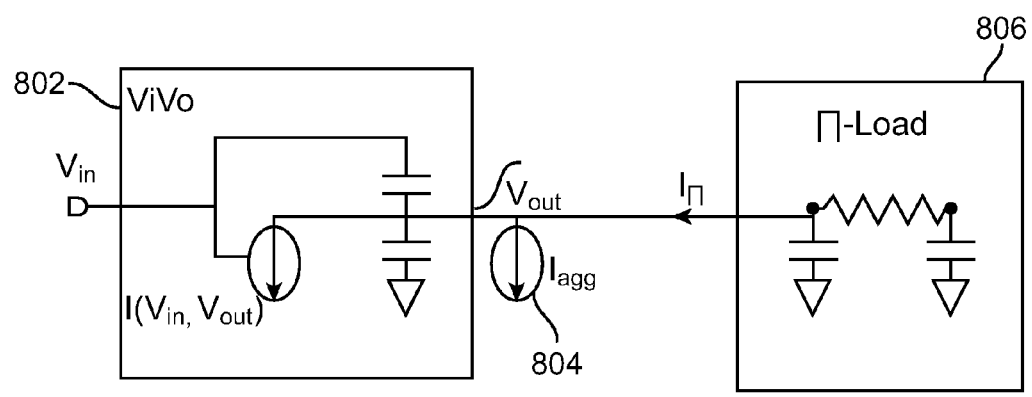
FIG. 8 is an illustrative drawing of the stage of FIG. 2, modeled in accordance with one embodiment of the invention, to more easily compute noisy transitions on a victim net driver output.

FIG. 8 is an illustrative drawing of a model 800 of the stage of FIG. 2, modeled in accordance with one embodiment of the invention, to more easily compute noisy transitions on a victim net driver output. The driver 202 in FIG. 2 is modeled in FIG. 8 as the ViVo CM 802. Aggressor-induced currents in the victim net are modeled as combined current source 804 shown in the figure as $I_{agg}$. These aggressor-induced currents 804 are determined using a computational model as described above with reference to FIG. 16. A Π-load 806 approximates the driver output point admittance of the original interconnect network at a prescribed frequency. More specifically, given that the fast transitions on the aggressor driver outputs are pre-computed as generally described with reference to FIG. 5, the aggressor-induced victim current responses $I_{o,k}$, generally described with reference to FIG. 16, can be found from Eq. (6) and then the combined current from aggressors $I_{agg}$ is determined by summing up the individual current responses appropriately shifted according to their respective alignment $τ_k$. The driver output admittance, represented by the term $Y_{0,0}$ can be approximated by a Π-load 806 with little loss of accuracy.

Once the noisy transition on the driver output is computed, the noisy transition on j-th receiver can be calculated analytically using the pre-calculated transfer functions as $$X_{N+j} = L^{-1}\{H_{j,o}L[X_o]\} + \sum_{k=1}^{N} V_{j,k}(t - τ_k), \quad (7)$$

where, $V_{j,k}(t)$ is the aggressor-induced voltage response on j-th receiver caused by the pre-computed fast transition on k-th aggressor defined by $$V_{j,k}(t) = L^{-1}\{H_{k,j}L[X_k^*(t)]\}. \quad (8)$$

In accordance with one inventive aspect of an embodiment of the invention, $V_k(t)$ only need to be computed once and then can be re-used for all alignment vectors τ similar to the current responses $I_k(t)$. Once $V_{i,k}(t)$ are computed, for each alignment vector τ the calculation of noisy transition at the receiver due to noisy transition on victim driver requires one convolution, $L\{H_{j,o}L[x_o]\}$. The voltage response at the receiver is then obtained from a superposition with time shifted known voltage responses from aggressors.

The described calculation of noisy transitions on receiver inputs is performed for each alignment chosen during the search for WC delay change. The computed noisy transition on the receiver input can be used to compute the delay change by using the traditional transition time metric $J_{ref}$.

However, in accordance with another inventive aspect, an alternative metric is used, referred to below as ROP (Receiver-Output Probing) metric, $J_{rop}$ which is based on propagation of the noisy transition to the receiver output:

$$J_{rop}[N+j(t)] = J_{ref}[Z_j(t)]. \quad (9)$$

Here $Z_j(t)$ denotes a transition on j-th receiver's output caused by the transition on its input denoted above as $X_{N+j}(t)$. The ROP metric has the following advantages over the conventional metric: (i) it makes the noisy waveform more regular since the receiver gate acts as a low-pass filter, and (ii) it accounts for the impact of actual waveform on delay of the receiver, and therefore improves the accuracy of delay change measured on this net.

The computations done on each alignment iteration includes two numerical simulations of a small nonlinear circuit (each for driver and for receiver) and one linear analytical simulation (propagation of noisy transition from driver output to receivers).

Thus, one advantage to the approach described herein is that separation of alignment-independent components of the problem from the alignment loop greatly reduces computational complexity of the proposed methodology.

Another advantage is that a simulation of the victim net comprising a nonlinear current source and first/last CCC of the gates and the Π-load provides an efficient computation framework for analysis. Furthermore, in a current embodiment, an efficient computational technique on reduced-order model of the interconnect is employed.

Constrained Optimization-Based Search for WC Aggressor Alignments

A constrained optimization process in accordance with one novel aspect of an embodiment of the invention is employed to efficiently identify worst-case (WC) aggressor alignment. The novel process employs an algorithm that iterates over aggressor alignments in a search of the WC delay change based on an ROP metric. This is done separately for each receiver connected to a victim net, since the type of receiver and its load affect the WC alignment and delay change.

Basically, the process involves nonlinear optimization with constrains (i.e., switching windows) to find the WC alignment between victim and aggressors transitions, and consequently delay change on the receivers input.

Constraints are given for each aggressor in the form of switching window (SW), calculated in a timer tool, such as (Cadence's CTE, for example). Each aggressor can switch within its switching window. The goal of the optimization process is to identify aggressor alignment that maximizes delay change due to the switching aggressors. WC max delay change represents the maximum pushout of late (noiseless) transition on outputs of victim stage due to aggressors switching in opposite direction to that of victim. WC min delay change represents the maximum pull-in of early (noiseless) transition on the outputs of victim stage to due aggressor switching in the same direction as the victim. As used herein, the terms "max delay" and "min delay" denote delay of, respectively, late and early transitions.

The constrained optimization process uses a two-step greedy algorithm. It is assumed that there are N respective (logically independent) aggressors able to switch within respective switching windows $[T_{1j}, T_{2j}]$. Ordinarily, N is between 1 and 10. Transitions on aggressor nets are assumed to be monotonic (rising or falling) functions of time. It can be proven that current response on victim's driver output to such monotonic transition on an aggressor is a unimodal (having a single peak) wave.

Figure 10:
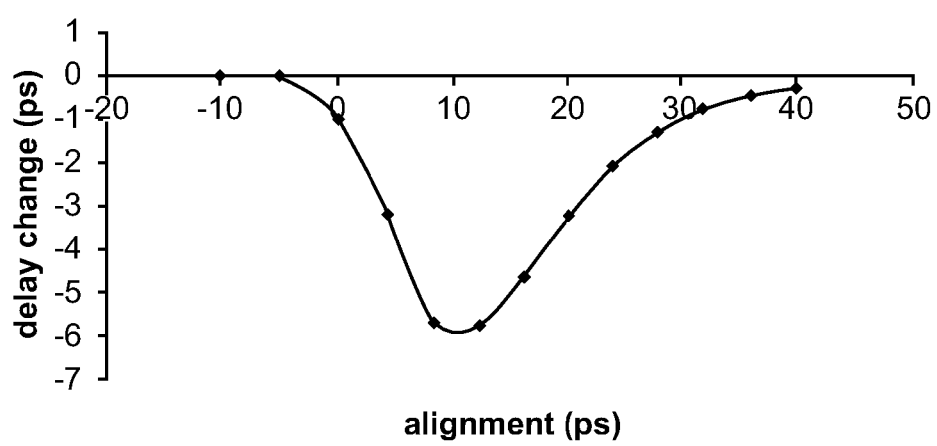
FIG. 10 is an illustrative drawing of a pushout curve showing pushout from nominal delay due to different aggressor alignments with a victim in accordance with an embodiment of the invention.

In order to describe the optimization method, we define a delay change curve as the delay change as function of alignment for min delay analysis, and "minus" (negated) delay change as function of alignment for max delay analysis. This way in both min and max delay analyses the delay change curve is of similar topology, and the optimization of alignment is formulated as finding of minimum of the delay change curve. FIG. 10 is an illustrative drawing of a delay change curve showing change of delay due to aggressor transitions for different aggressor alignments with the victim in accordance with a present embodiment of the invention.

A typical delay change curve has a single minimum (representing negative maximal delay change) and asymptotically approaches zero away from the peak since the effect of crosstalk due to the aggressor transitions becomes weaker if they are aligner far away from the victim transition. Each enlarged data point in the curve represents a particular alignment of transitions of aggressors relative to transition on the victim net. During a first step, respective mutual alignment between group of aggressors and the victim, are selected by one of two methods. According to the first method, subject to SW constraints, each aggressor-induced current waveform is aligned by its peak with $J_{ref}$ of transition time of noiseless transition on the victim driver output under scrutiny. According to the second method, subject to SW constraints, each aggressor-induced voltage waveform is aligned such that peak of each aggressor voltage response is aligned with $J_{ref}$ transition time of noiseless transition on the receiver input under scrutiny.

Those aggressors that can not be aligned (by their respective responses peaks) with ($J_{ref}$ transition time of) noiseless transition on victim, they are positioned in such a way that the respective response peak will be as close as possible to a victim's noiseless ($J_{ref}$) transition time.

The first step of the optimization procedure, the search for the WC alignment of a group of aggressors is done in terms of average alignment, defined as an average of each aggressor alignment. As described above, the mutual alignment of aggressors is defined by the peak times of their respective current or voltage responses. In the case of no timing constraints or when the constraints are such that individual aggressor responses can be peak-aligned in one of the two described methods, the average alignment is same as that of each aggressor.

Also, an averaged alignment is determined by averaging peak times of each response. As described above in detail, the delay change is then computed on the receiver output through propagation of noisy responses according to the described above 3-step calculation procedure: (i) determination of victim driver output response, (ii) determination of receiver input response, (ii) determination of receiver output response.

During a first step of the optimization procedure being described, the search of optimal (WC) alignment is performed in terms of the averaged alignment $\zeta$ which is defined as an average of times of each aggressor peak current or peak voltage on a victim transition.

$$\zeta = \frac{1}{N} \sum_{k=1}^{N} \tau_k \quad (10)$$

where $\tau_k$ is the transition time of the $k^{th}$ aggressor, and N is the number of aggressors.

On each iteration the next value of average alignment, $\zeta_{j+1}$ is found using quadratic interpolation technique. In particular, we find the quadratic function $\Delta=a+b*\zeta+c*\zeta^2$, where $\Delta$ denotes the delay change computed using the described above 3-step process for the correspondent alignment vector, interpolating the three worst (in terms of delay change, $\Delta$) points $\{\Delta_{jk}, \zeta_{jk}\}$, k=1, 2, 3. Referring to FIG. 10, the predicted value of $\zeta_{-j+1}$ is such where the quadratic function reaches its maximum. Thus, three selected previous values of $\zeta$ are used to interpolate a next value of $\zeta$.

Figure 11:
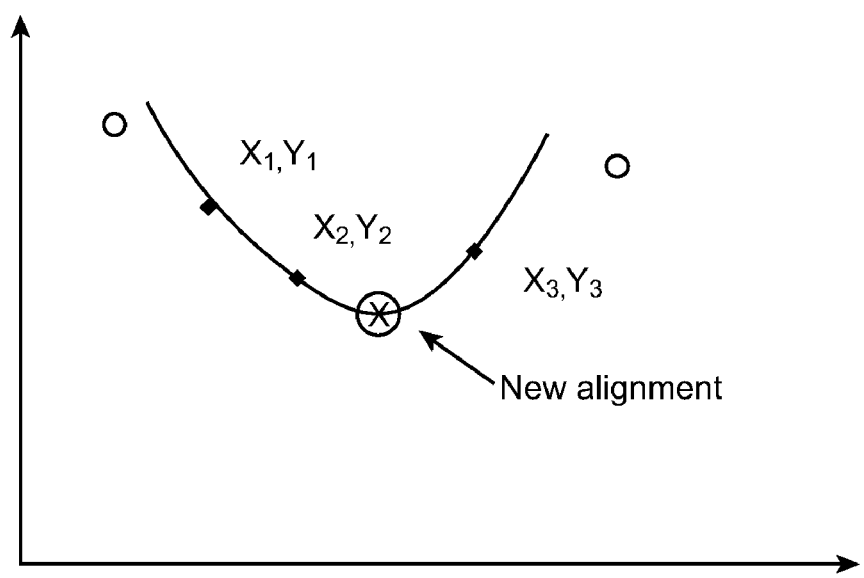
FIG. 11 is an illustrative drawing of a quadratic curve interpolating 3 worst delay results, and used for finding next prediction of WC alignment.

FIG. 11 is an illustrative drawing of a refined optimization curve used for independent optimization of individual aggressors in accordance with a present embodiment of the invention. During a second (optional) optimization step, after an optimal alignment of group of aggressors has been found, a refined optimization is performed for each aggressor independently, which requires one or two additional simulations per each aggressor. This "greedy" approach is based on the facts that the delay change curve is flat near its top, and impacts from each individual aggressor on victim delay are almost independent.

More specifically, in a one embodiment of the invention, the first step optimization is performed for a single variable defined as the average of the peak times of each aggressor's voltage response as described by (10), defined relative to the nominal transition time on the receiver input:

On each iteration of the optimization loop a so-called suggested averaged alignment, $\zeta_j$ is determined with which an attempt is made to try to satisfy SW timing constraints. If the voltage response from an aggressor cannot be peak-aligned with $\zeta_{j+1}$ it is positioned as close as possible to it, while satisfying SW constraints. This means that the transition on the aggressor occurs on the correspondent boundary of its SW. This results in the so-called actual averaged alignment $\zeta$ which may be different from the suggested alignment due to timing constraints. As explained above, an averaged alignment represents an averaging of peak time of each aggressor response.

After the correspondent delay change $\Delta_j$ for a receiver is calculated on j-th iteration, a new suggested alignment, $\zeta_{j+1}$ is found as described above, by searching for the maximum of a quadratic function interpolating the worst three actual alignment points and their correspondent delay changes.

To begin the process, the first three value of $\zeta$ are chosen based on a heuristic. In a present embodiment, the heuristic uses t*, t*+0.2T and t*−0.2T as the three initial point where T is the slew, and t* is time when the nominal transition on the receiver crosses 50% Vdd(5% Vdd) for max (min) delay change analysis.

The first part of the optimization process stops when one of the following events occur: (1) The process converges in terms of delay change; (2) The delay change values are oscillating; (3) Three worst points lie on a straight line; or (4) The maximum number of iterations is exceeded.

Case 3 indicates a severe delay and noise problem on the net: the noise glitch induced by switching aggressors after the victim's transition end propagates to the receiver output where it crosses 50% Vdd.

If the transition on the receiver output corresponding to the WC alignment is non-monotonic, a warning is issued as it might indicate a potential functional failure or a high inaccuracy of the delay analysis.

Figure 12:
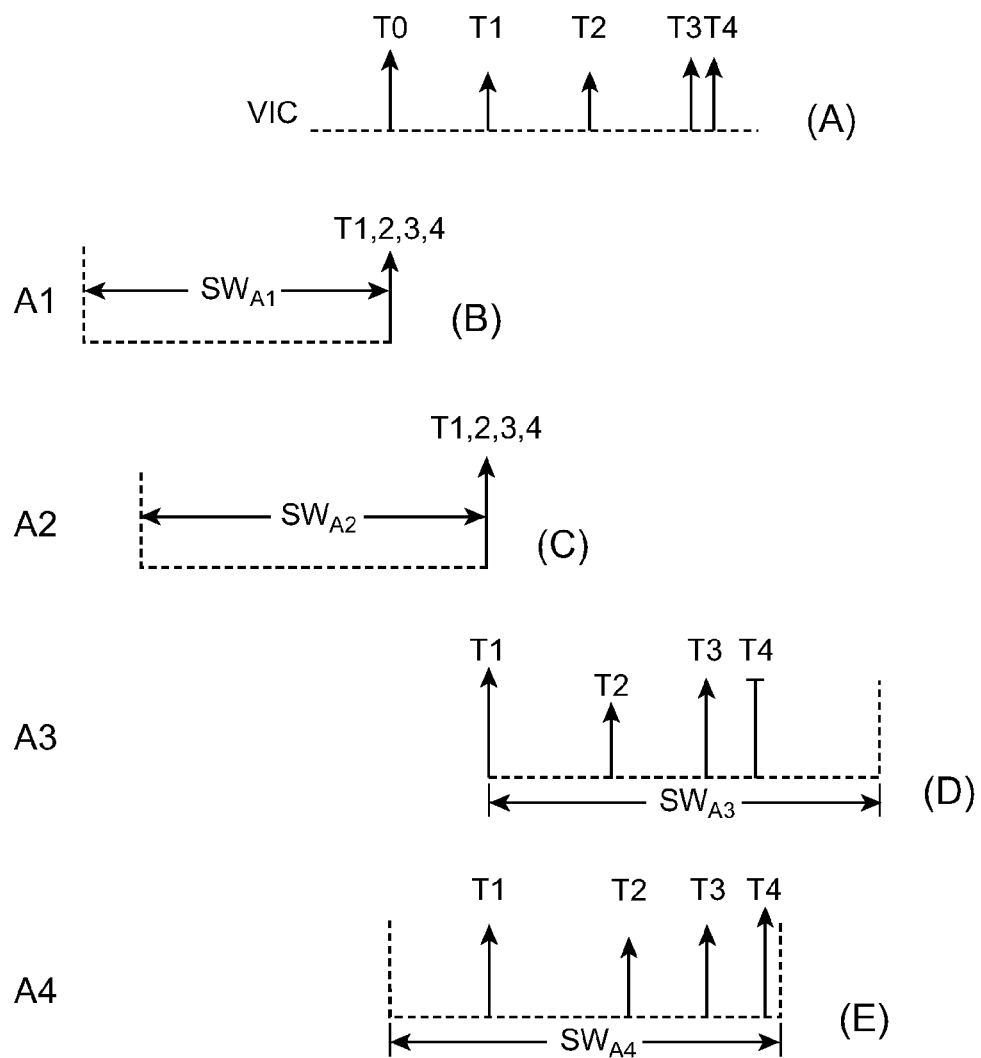
FIGS. 12A-12E illustrate an example of constrained alignment of multiple aggressors on a victim for a maxrise delay change analysis in accordance with an embodiment of the invention.

FIGS. 12A-12E illustrate an example of constrained alignment of four aggressor-induced victim waveforms (A1, A2, A3, A4) on a victim (VIC) for a maxrise delay change analysis in accordance with a present embodiment of the invention. Analogous alignments and delay change determinations can be performed for minrise, maxfall and minfall. In FIGS. 12A-12E, aggressor-induced victim net waveform alignment is constrained by aggressor switching windows (SW), which may not overlap with the nominal victim transition time. More specifically, FIGS. 12A-12E show a victim's noisy transition times computed using ROP metric and the aggressors' switching windows and peak times on each of multiple iterations. The vertical spikes in FIG. 12A represent five (5) different nominal victim transition times T0 to T4, all based on $J_{ref}$ metric with $V_{ref}$=50% Vdd. In other words, vertical spikes in FIG. 12A represent different occurrences times of the $J_{ref}$, or the 50% Vdd crossing time. The T0 switching time represents a noiseless transition time, i.e., no aggressors, while the other switching times T1 to T4 represent transition times in the presence of aggressors. The aggressor-induced victim waveform peak times for four respective aggressors A1-A4 are represented by the spikes in respective FIGS. 12B-12E. In the example of FIGS. 12A-12E, there is a different alignment of aggressors-induced waveforms during each of the four iteration alignments occurring at times T1 to T4. Moreover, in this example, the alignment times are selected so as to achieve a convergence at iteration T4. The vertical dashed lines in FIGS. 12B-12E represent boundaries of switching windows of the aggressors, and enumerated spikes represent times of correspondent voltage peak at the receiver.

A first iteration T1, shown in FIGS. 12B-12E shows an example of an attempt to align the peaks of aggressor-induced victim waveforms of A1-A4 with 50% Vdd of nominal transition on victim (VIC), denoted by spike T1 of FIG. 12A. The nominal VIC transition time T1 falls within the switching windows of aggressors A2-A3, but does not fall within the switching window of aggressor A1. Therefore, the peaks of aggressors-induced victim waveforms A2-A4 are aligned with VIC transition T1, and in accordance with one aspect of the invention, the peak of aggressor-induced victim waveform A1 is aligned with an edge of the A1 SW closest to the VIC transition T1. An average alignment $\zeta_1$ is calculated for the T1 alignment.

$$\zeta_1 = \frac{1}{4} \sum_{k=1}^{4} \tau_k$$

The second iteration T2, shows an example of an attempt to align the peaks of aggressor-induced victim waveforms A1-A4 with the nominal transition on victim (VIC), denoted by spike T2. The nominal VIC transition time T2 falls within the switching windows of aggressors A3-A4, but does not fall within the switching windows of aggressors A1-A2. Therefore, the peaks of aggressors-induced victim waveforms A3-A4 are aligned with VIC transition T2, and the respective peaks of aggressor-induced victim waveforms A1-2 are aligned with respective edges of the A1-A2 SWs closest to the VIC transition T2. An average alignment $\zeta_2$ is calculated for the T2 alignment using the above formulation.

The third iteration T3, shows an example of an attempt to align the peaks of aggressor-induced victim waveforms A1-A4 with the nominal transition on victim (VIC), denoted by spike T3. The nominal VIC transition time T3 falls within the switching windows of aggressors A3-A4, but does not fall within the switching windows of aggressors A1-A2. Therefore, the peaks of aggressors-induced victim waveforms A3-A4 are aligned with VIC transition T3, and the respective peaks of aggressor-induced victim waveforms A1-2 are aligned with respective edges of the A1-A2 SWs closest to the VIC transition T3. An average alignment $\zeta_3$ is calculated for the T3 alignment using the above formulation.

The fourth iteration T4, shows an example of an attempt to align the peaks of aggressor-induced victim waveforms A1-A4 with the nominal transition on victim (VIC) denoted by spike T4. The nominal VIC transition time T4 falls within the switching windows of aggressors A3-A4, but does not fall within the switching windows of aggressors A1-A2. Therefore, the peaks of aggressors-induced victim waveforms A3-A4 are aligned with VIC transition T4, and the respective peaks of aggressor-induced victim waveforms A1-2 are aligned with respective edges of the A1-A2 SWs closest to the VIC transition T4. After the fourth iteration the process is stopped since the delay changes converge.

Overall Flow

Figure 13A:
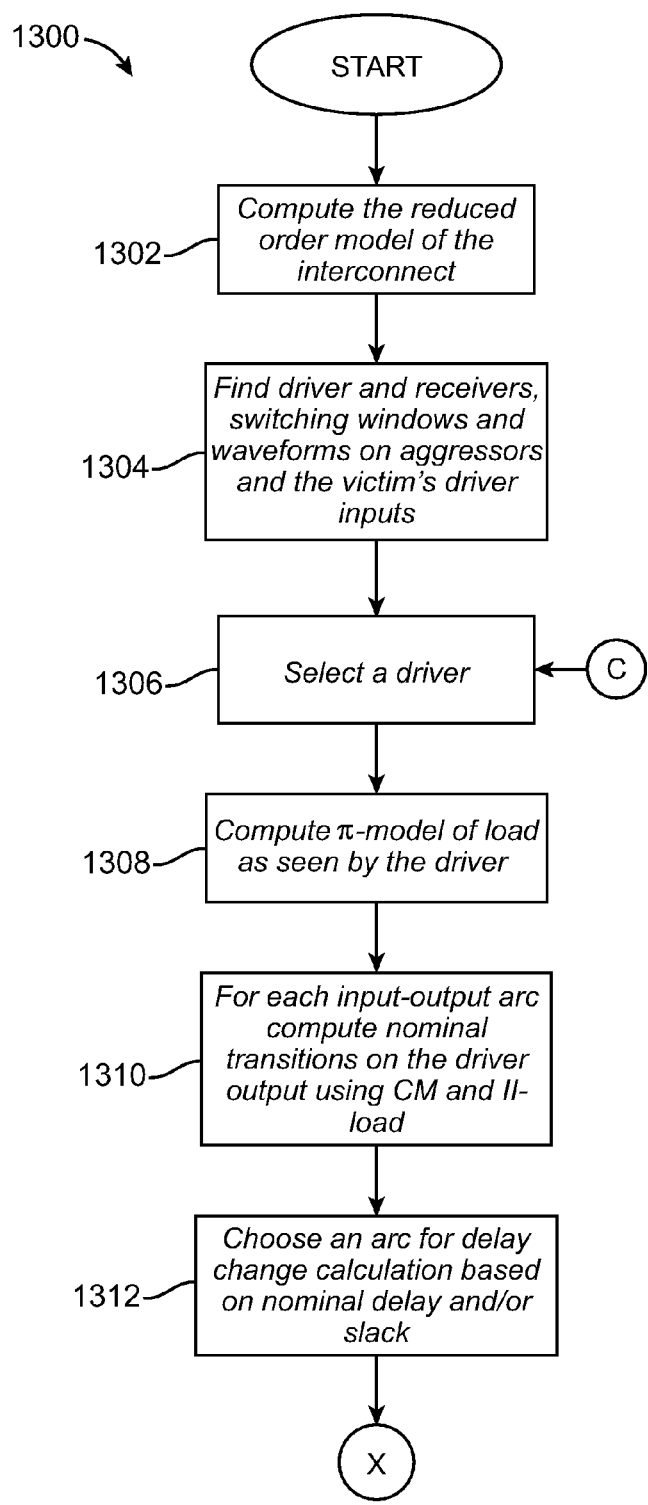
FIGS. 13A-13C is an illustrative flow diagram showing overall flow of aggressor crosstalk delay change analysis in accordance with an embodiment of the invention.
Figure 13B:
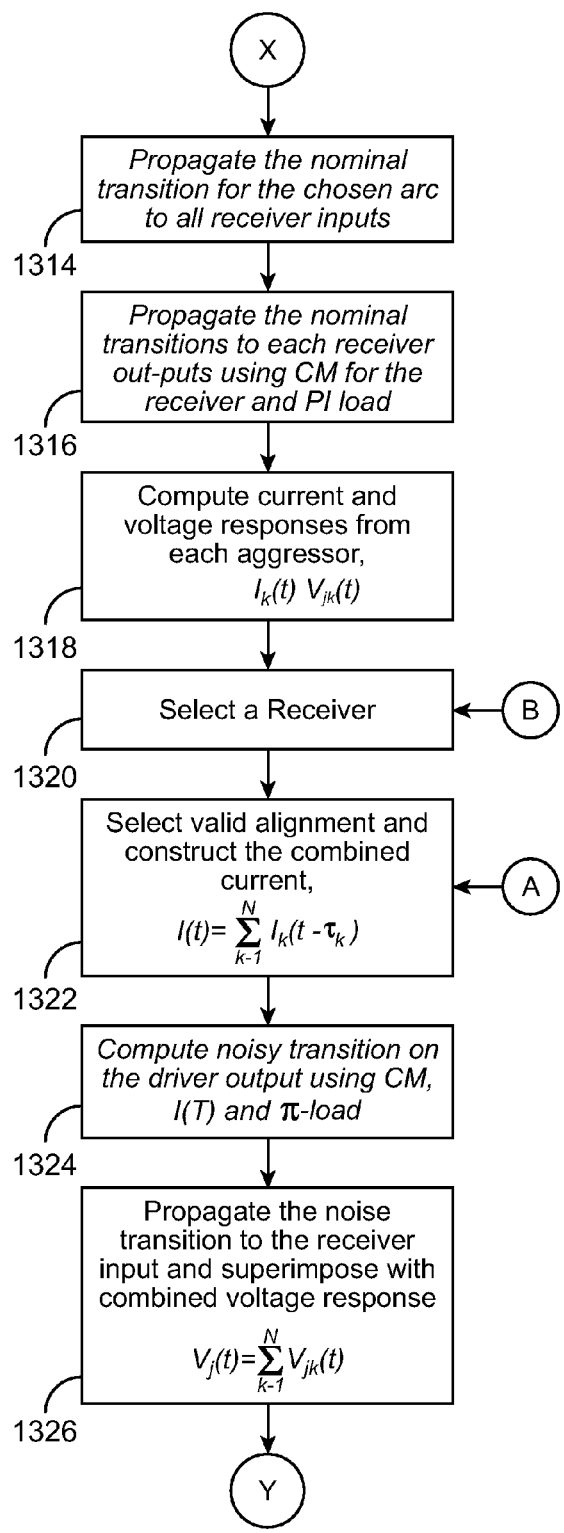
Figure 13C:
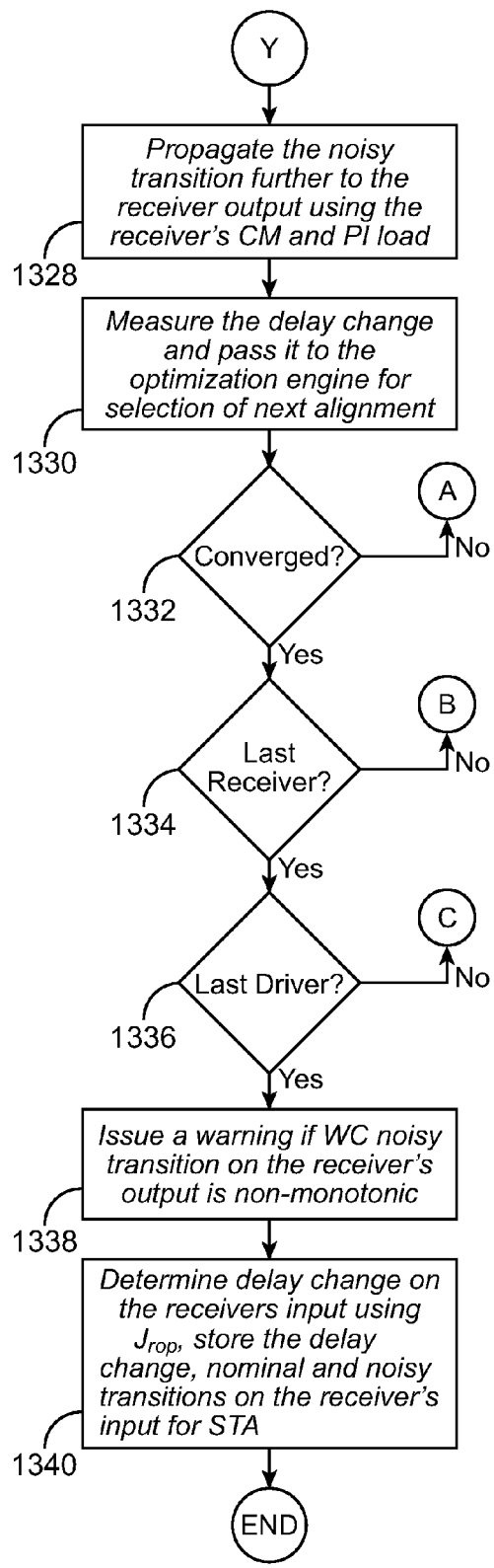
Figure 14A:
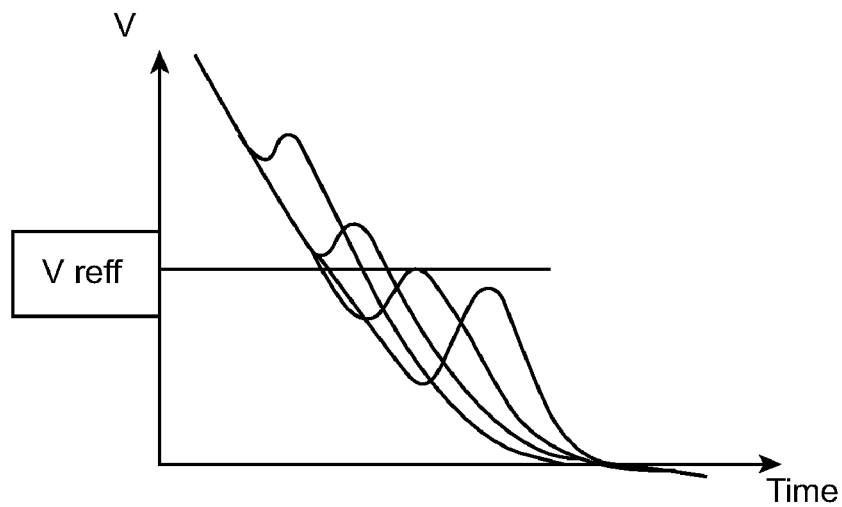
FIGS. 14A and 14B represent a prior methodology for measurement of aggressor-induced crosstalk delay.
Figure 14B:
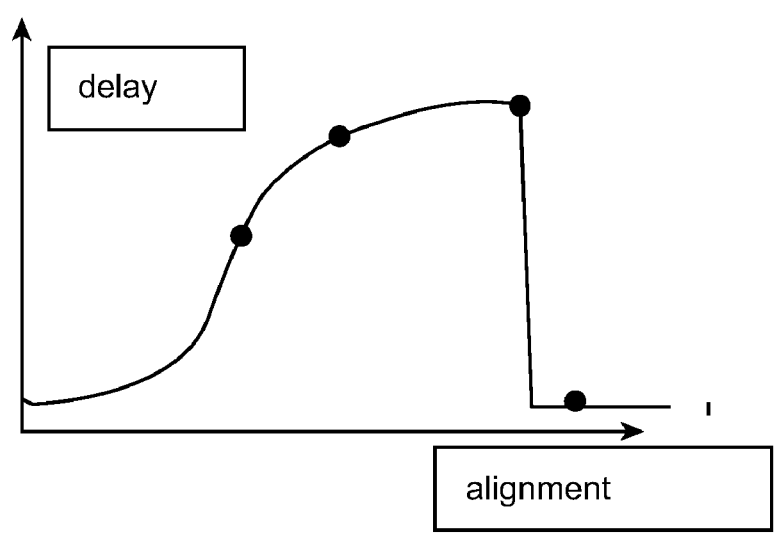

FIGS. 13A-13C is an illustrative flow diagram 1300 of the overall flow of a delay change determination process in accordance with one embodiment of the invention. The process determines aggressor-induced delay change in a victim net. The process is implemented using a computer program. The program can be implemented as computer program instructions encoded in a computer readable medium. The steps in FIGS. 13A-13C are representative of computer program instructions encoded in a computer readable medium.

In step 1302, a reduced-order computational model is determined for an interconnect network of a given stage, such as stage 200 of FIG. 2, that includes a victim net of interest. The reduction results in transfer functions $H_{jk}(s)$, $Y_{jk}(s)$ from all ports (driver inputs) to all ports and taps (receiver inputs), where j is a driver output and k is a receiver input. In step 1304, for the given stage, drivers, receivers, switching windows and aggressor waveforms and driver inputs are identified from the design database. As explained with reference to FIGS. 2-5, aggressor waveforms are pre-computed for aggressor nets of the given stage.

In step 1306, a victim net driver identified in step 1304 for a driver that has not yet been analyzed is selected for analysis. In step 1308, a π-model of load is determined as seen by an output node of the driver selected in step 1306. In step 1310, π-load for the selected driver is computed using the results of interconnect reduction, and a respective nominal transition is computed on the driver output using CM for each respective arc between the inputs to the driver's last CCC and its output.

In step 1312, an arc between the selected driver input and output is selected for delay change calculation based on nominal delay and/or slack on the driver output. In step 1314, a nominal (noiseless) transition is propagated for the chosen arc to receiver inputs of all receivers identified in step 1304. In step 1316, the nominal transitions are propagated to receiver outputs of all receivers identified in step 1304. A respective receiver CM and a corresponding PI-load is used to propagate from receiver input to receiver output for each respective identified receiver. The PI-load of each receiver is available from the earlier stage where fast transition on all nets are computed.

In step 1318, aggressor-induced victim net current and voltage waveforms induced in the victim by pre-computed aggressor waveforms $I_k(t)$, $V_{jk}(t)$ are determined.

In step 1320, a receiver, identified in step 1304 that has not yet been analyzed is selected for analysis. In step 1322, the constrained optimization process is used to interpolate a valid aggressor alignments $\tau = \{\tau_1, \ldots, \tau_N\}$ and a combined current is determined for such alignment, $$I(t) = \sum_{k=1}^{N} I_k(t - \tau_k)$$

In step 1324, a noisy (subject to aggressor-induced current) transition on the output node of the selected driver is computed using the driver's CM, I(t) and the Π-load seen by the driver's output node. In step 1326, the determined noisy transition is propagated from the driver output to the selected receiver input using the determined transfer functions, and the propagated noisy transition is superimposed with an aggressor-induced combined voltage response, $$V_J(t) = \sum_{k=1}^{N} V_{j,k}(t - \tau_k).$$

In step 1328, the noisy voltage transition at the input node of the selected receiver is propagated to the receiver output node. The receiver's CM and a respective Π-load are used to accomplish the propagation from receiver input to receiver output. In step 1330, the delay change is determined as between nominal propagation delay determined for the driver-receiver pair in step 1316 and noisy (aggressor-impacted) delay determined in step 1328. The delay change (i.e., push-out or pull-in) is passed along to the constrained optimization process for interpolation of a next aggressor alignment.

In decision step 1332, a determination is made as to whether the optimization process indicates that there has been convergence, such that worst case (WC) aggressor alignment has been identified. As the convergence criterion we used the condition that a difference between two delay changes is smaller than a certain fraction of nominal transition slew. If the answer in decision step 1332 is no, then the process loops back to step 1322, and a next aggressor alignment is interpolated for analysis. If the answer in step 1332 is yes, then, the process moves to decision step 1334.

In decision step 1334, a determination is made as to whether all receivers of the given stage have been analyzed. If the answer in decision step 1334 is no, then the process loops back to step 1320, and a next receiver is selected for analysis. If the answer in decision step 1334 is yes, then the process moves to decision step 1336.

In decision step 1336, a determination is made as to whether all drivers of the given stage have been analyzed. If the answer in decision step 1336 is no, then the process loops back to step 1306, and a next driver is selected for analysis. If the answer in decision step 1336 is yes, then the process moves to step 1338.

In step 1338, a warning is issued if WC noisy transition on the selected receiver's output is non-monotonic. In step 1340, WC delay change is determined based upon the analyses performed for all driver-receiver combinations using $J_{rop}$. The nominal and WC (noisy) delay change is stored on the receiver's input for use in STA.

It will be understood that the foregoing description and drawings of preferred embodiment in accordance with the present invention are merely illustrative of the principles of this invention, and that various modifications can be made by those skilled in the art without departing from the scope and spirit of the invention.

The invention claimed is:

1. A computer implemented method of determining aggressor-induced delay change in a victim net of a stage of an integrated circuit design, the stage including a victim net driver gate, a receiver gate and an interconnect network including a victim net and an aggressor net, comprising:
   providing an input and output voltage dependent current model of the victim net driver gate;
   producing a model of a load presented to an output of the driver gate by the interconnect network;
   producing a model of the interconnect network of the stage, which can be used to propagate a waveform from an output of the driver gate to an input of the receiver gate;
   simulating behavior of the victim net during nominal (noiseless) transition by performing steps including,
      providing a signal transition at an input of the driver gate;
      using the current model of the driver gate and the load model of the interconnect network to produce a nominal driver gate output waveform resulting from the provided input signal transition; and
      using the interconnect model to propagate the nominal driver gate output waveform from the driver gate output to the receiver gate input;
   simulating behavior of the victim net during noisy transition by performing steps including,
      providing a signal transition at an input of the driver gate;
      providing an aggressor-induced current waveform to an output of the driver gate;
      using the current model of the driver gate and the load model of the interconnect network to produce a noisy driver gate output waveform resulting from the provided input signal transition and the aggressor-induced current waveform; and
      using the interconnect model to propagate the noisy driver gate output waveform from the driver gate output to the receiver gate input;
   providing an aggressor-induced voltage waveform to an input of the receiver gate;
   producing a value representing a difference between delay associated with the simulated noiseless transition and delay associated with the simulated noisy transition; and
   saving the produced value in computer readable memory.

2. The method of claim 1,
   wherein the output current-dependent model of a driver of the victim net includes a ViVo model.

3. The method of claim 1,
   wherein the output current-dependent model of a driver of the victim net includes a ViVo model; and
   wherein the load model includes a Ø-load model.

4. The method of claim 1 further including,
   providing an input and output voltage dependent current model of the receiver gate;
   wherein simulating behavior of the victim net during nominal transition further includes using at least the receiver gate current model to produce a nominal receiver gate output waveform resulting from the propagated nominal driver gate; and
   wherein simulating behavior of the victim net during noisy transition further includes using at least the receiver gate current model to produce a noisy receiver gate output waveform resulting from the propagated noisy driver gate output waveform and the at least one aggressor-induced voltage waveform provided to the receiver model input.

5. The method of claim 1,
   wherein simulating behavior of the victim net during nominal (noiseless) transition further includes,
   using a current model of the receiver gate to produce a receiver gate output waveform resulting from the propagated nominal driver gate output waveform; and wherein simulating behavior of the victim net during noisy transition further includes, using the current model of the receiver gate to produce a receiver gate output waveform resulting from the propagated noisy driver gate output waveform and the aggressor-induced voltage waveform to an input of the receiver gate.

6. The method of claim 1 further including:
precomputing the current waveform through a driver gate pin induced by a transitioning aggressor net to produce the aggressor-induced current waveform; and
precomputing the voltage waveform at a receiver pin induced by the transitioning aggressor net to produce the aggressor-induced voltage waveform.

7. The method of claim 1,
wherein providing a model of the interconnect network includes providing a computational model that includes a transfer function that includes an admittance matrix that relates voltage on one port of the matrix to current on another port of the matrix;
using the computational model to compute the aggressor-induced current waveform; and
using the computational model to compute the aggressor-induced voltage waveform.

8. The method of claim 1,
wherein the load model approximates output point admittance of the interconnect network.

9. The method of claim 1,
wherein the model of the load represents a Π-load model and further includes a model of capacitance of the driver gate output pin.

10. An article of manufacture including a computer readable medium encoded with an information structure representing a driver circuit, the information structure comprising:
a current model that associates instantaneous values of input node voltage, output node voltage and output node current of the driver circuit;
a model of capacitance between an input node and an output node of the driver circuit; and
a model of capacitance between the output node of the driver circuit and a ground potential;
wherein the information structure is operable to cause a computer to associate current drawn by the driver circuit output node in response to voltages applied to the driver circuit input and output nodes.

11. The article of manufacture of claim 10 wherein,
the driver circuit includes multiple channel connected cells; and
the driver circuit current model includes a model of a last channel connected component of the driver circuit.

12. The article of manufacture of claim 10 wherein,
the driver circuit includes multiple channel connected cells; and
the driver circuit current model includes a model of only a last channel connected component of the driver circuit.

13. The article of manufacture of claim 10,
wherein the driver circuit includes multiple channel connected cells; and
wherein the driver circuit current model includes a model of a last at least one channel connected component of the driver circuit; and further including:
information concerning slew on the input node of the at least one component characterized as a function of slew on at least one input node of the driver.

14. The article of manufacture of claim 10,
wherein the driver circuit includes multiple channel connected cells; and
wherein the driver circuit current model includes a model of only a last channel connected component of the driver circuit; and further including:
information concerning slew on the input node of the at least one component characterized as a function of slew on at least one input node of the driver.

15. An article of manufacture including a computer readable medium encoded with an information structure representing a driver circuit, the information structure comprising:
a current model that associates instantaneous values of driver circuit input node voltage, driver circuit output node voltage and driver circuit output node current;
a model of miller capacitance of the output node of the driver circuit; and
a model of ground capacitance of the output node of the driver circuit;
wherein the information structure is operable to cause a computer to associate current drawn by the driver circuit output node in response to voltages applied to the driver circuit input and output nodes.

16. The article of manufacture of claim 15,
wherein the driver circuit includes multiple channel connected cells; and
wherein the driver circuit current model includes a model of only a last channel connected component of the driver circuit; and further including:
information concerning slew on the input node of the at least one component characterized as a function of slew on at least one input node of the driver.

17. An article of manufacture including a computer readable medium encoded with computer instructions to cause the computer to perform a circuit simulation process comprising the steps of:
for each of a plurality of different pairs of first and second DC voltage values,
sensitizing an input node of a cell model of the driver circuit with a first DC voltage value;
sensitizing an output node of the cell model with a second DC voltage value;
generating a value of current drawn by the output node of the cell model based upon the provided first DC voltage value and the provided second DC voltage value; and
saving the generated value in computer readable memory.

18. The article of manufacture of claim 17, the process further including:
producing a table representing respective associations among respective pairs of first DC voltage values and second DC voltage values and respective current values generated based upon such respective pairs.

19. The article of manufacture of claim 17 wherein,
each respective first DC value includes a constant DC value; and
each respective second DC value includes a constant DC value.

20. The article of manufacture of claim 17 wherein,
the driver circuit model includes a model of at least one channel connected component of the driver circuit.

21. The article of manufacture of claim 17 wherein,
the driver circuit model includes a model of a last channel connected component of the driver.

22. The article of manufacture of claim 17 wherein,
the driver circuit model includes a model of only a last channel connected component of the driver.

23. The article of manufacture of claim 17, the process further including:
producing a model of capacitance between the input node and the output node of the driver circuit; and
producing a model of capacitance between the output node of the driver circuit and a ground potential.

24. The article of manufacture of claim 17, the process further including:
determining capacitance between the input node and the output node of the driver circuit through transient analysis; and
determining capacitance between the output node the driver circuit and a ground potential through transient analysis.

25. The article of manufacture of claim 17,
wherein the driver circuit includes multiple channel connected cells; and
wherein the driver circuit model includes a model of only a last channel connected component of the driver; the process further including:
determining a slew on an input node of the cell model of the driver circuit characterized as a function of slew on an input node of the cell model of the driver circuit.

26. The article of manufacture of claim 17,
wherein the driver circuit model includes only a model of a last channel connected component of the driver; further including:
determining a slew on an input node of the cell model characterized as a function of slew on an input node of the cell model of the driver circuit.

27. An article of manufacture including a computer readable medium encoded with a current model of a driver circuit, the current model operable to cause the computer to associate input voltage values, output voltage values and current values, the current model produced by a process including the steps of:
for each of a plurality of different pairs of first and second DC voltage values,
sensitizing an input node of a cell model representing the driver circuit with a first DC voltage value;
sensitizing an output node of the cell model with a second DC voltage value; and
generating a value of current drawn by the output node of the cell model based upon the provided first DC voltage value and the provided second DC voltage value.

28. The article of claim 27 wherein the process further includes the step of:
producing a table representing the respective associations among first DC voltage values, second DC voltage values and current values.

29. The article of claim 27 wherein,
each respective first DC value includes a constant DC value; and
each respective second DC value includes a constant DC value.

30. An article of manufacture including a computer readable medium encoded with instructions to cause the computer to perform a method of simulating aggressor-induced behavior of a driver circuit and an interconnect network driven by the driver circuit, the method comprising:
providing a voltage signal transition on an input of a current model representing the driver circuit, the current model associating instantaneous values of input voltage, output voltage and output current of the driver circuit;
providing an aggressor induced current waveform on a node interconnecting an output of the current model and a load model representing the interconnect network, the load model approximating output point admittance of the interconnect network; and
using the current model and the load model to produce a voltage waveform on the output of the current model based upon the received input voltage signal transition and the received aggressor induced waveform;
wherein the voltage waveform represents a voltage transition on the driver circuit output.

31. The article of manufacture of claim 30,
wherein the current model includes a model of capacitance associated with the driver circuit.

32. The article of manufacture of claim 30,
wherein the current model includes a model of miller capacitance associated with the driver circuit; and
wherein the current model includes a model of ground capacitance associated with the driver circuit.

33. The article of manufacture of claim 30 wherein,
the load model includes a Π-model.

34. The article of manufacture of claim 30 wherein,
the at least one component comprises a channel connected component.

35. The article of manufacture of claim 30 wherein,
the current model includes a model of a last channel connected component of the driver.

36. A computer implemented method of determining aggressor-induced delay change in a victim net in an integrated circuit design, the victim net including a driver circuit and an interconnect network between the driver circuit and a receiver circuit, the method comprising:
simulating behavior of the victim net during nominal (noiseless) transition by performing steps including,
providing a voltage signal transition on an input of the driver circuit;
using a driver circuit current model and a load model approximating output point admittance of the interconnect network presented to an output of the driver circuit, to produce a nominal driver circuit output voltage waveform resulting from the provided transition signal; and
using a computational model of the interconnect network to propagate the nominal driver circuit output voltage waveform to an input of the receiver circuit;
simulating behavior of the victim net during noisy transition by performing steps including,
providing a voltage signal transition on the input of the driver circuit;
providing an aggressor induced current waveform to the output node of the driver circuit;
using the driver circuit current model and the load model to produce a noisy driver circuit output voltage waveform resulting from the provided transition signal and the aggressor-induced current waveform; and
using the computational model of the interconnect network to propagate the noisy output voltage waveform to an input of the receiver circuit;
producing a value representing a difference between delay associated with the simulated noiseless transition and delay associated with the simulated noisy transition; and
saving the produced value in computer readable memory.

37. The method of claim 36,
wherein the current model includes a model of capacitance of the driver circuit.

38. The method of claim 36,
wherein the current model includes a model of miller capacitance of the driver circuit; and
wherein the current model includes a model of gate capacitance of the driver circuit.

39. The method of claim 36 wherein,
the load model includes a Π-model.

40. The method of claim 36 wherein,
the current model includes a model of a last channel connected component of the driver circuit.

41. The method of claim 36 wherein,
the computational model of the interconnect network includes one or more transfer functions that relate a signal on a driver circuit output node to a signal on a receiver circuit input node.

42. The method of claim 36 wherein,
the model of the receiver includes a current model.

43. The method of claim 36 wherein,
the driver circuit current model associates instantaneous values of input node voltage, output node voltage and output node current of the driver circuit.

44. The method of claim 36 wherein,
the driver circuit current model associates instantaneous values of input node voltage, output node voltage and output node current of the driver circuit; and
the driver circuit current model includes a model of capacitance between an input node and an output node of the driver circuit; and
the driver circuit current model includes a model of capacitance between the output node of the driver circuit and a ground potential.

45. The method of claim 36,
wherein simulating behavior of the victim net during nominal transition further includes,
using a receiver circuit current model of the receiver circuit to produce a receiver circuit nominal output waveform, resulting from the propagated nominal output voltage waveform; and
wherein simulating behavior of the victim net during noisy transition further includes,
using the receiver circuit current model to produce a receiver circuit noisy output waveform, resulting from the propagated noisy output voltage waveform.

46. The method of claim 36,
wherein simulating behavior of the victim net during nominal transition further includes,
using a receiver circuit current model of the receiver circuit to produce a receiver circuit nominal output waveform, resulting from the propagated nominal output voltage waveform; and
wherein simulating behavior of the victim net during noisy transition further includes,
providing an aggressor-induced voltage waveform at an input of the receiver circuit; and
using the receiver circuit current model to produce a receiver circuit noisy output waveform, resulting from the propagated noisy output voltage waveform and the aggressor-induced voltage waveform at an input of the receiver circuit.

47. An article of manufacture including a computer readable medium encoded with instructions to cause the computer to perform a method of determining aggressor-induced delay change in a victim net of a stage of an integrated circuit design, the stage including a victim net driver gate, a receiver gate and an interconnect network including a victim net and an aggressor net, the method comprising:

simulating behavior of the victim net during nominal (noiseless) transition by performing steps including,
providing a signal transition to an input of the driver gate;
using a current model of the driver gate and a load model of the interconnect network to produce a nominal driver gate output waveform resulting from the provided input signal transition; and
using a model of the interconnect network to propagate the nominal driver gate output waveform from the driver gate output to the receiver gate input;
simulating behavior of the victim net during noisy transition by performing steps including,
providing a signal transition at the input of the driver gate;
providing at least one aggressor-induced current waveform to an output of the driver gate;
using the current model of the driver gate and the load model of the interconnect network to produce a noisy driver gate output waveform resulting from the provided input signal transition and the at least one aggressor-induced current waveform provided to the driver gate output; and
using the interconnect model to propagate the noisy driver gate output waveform from the driver gate output to the receiver gate input;
providing at least one aggressor-induced voltage waveform to an input of the receiver gate;
producing a value representing a difference between delay associated with the simulated noiseless transition and delay associated with the simulated noisy transition; and
saving the produced value to computer readable memory.

48. The article of claim 47, wherein the method further including:
providing as the current model, an input and output voltage dependent current model of the driver gate;
producing as the load model, a model of a load presented to an output of the driver gate by the interconnect network; and
producing as the model of the interconnect network, a computational model of the interconnect network that includes one or more transfer functions that relate a signal on a driver gate output node to a signal on a receiver gate input node.

49. The article of claim 47,
wherein simulating behavior of the victim net during nominal (noiseless) transition further includes,
using a current model of the receiver gate to produce a receiver gate output waveform resulting from the propagated nominal driver gate output waveform; and
wherein simulating behavior of the victim net during noisy transition further includes,
using the current model of the receiver gate to produce a receiver gate output waveform resulting from the propagated noisy driver gate output waveform.

50. The article of claim 47,
wherein simulating behavior of the victim net during nominal (noiseless) transition further includes,
using a current model of the receiver gate to produce a receiver gate output waveform resulting from the propagated nominal driver gate output waveform; and
wherein simulating behavior of the victim net during noisy transition further includes,
providing an aggressor-induced voltage waveform at an input of the receiver gate; and using the current model of the receiver gate to produce a receiver gate output waveform resulting from the propagated noisy driver gate output waveform and the aggressor-induced voltage waveform at an input of the receiver gate.

51. An article of manufacture including a computer readable medium encoded with instructions to cause the computer to perform a method of determining aggressor-induced delay change in a victim net of a stage of an integrated circuit design, the stage including a victim net driver gate, a receiver gate and an interconnect network including the victim net and an aggressor net, the method comprising:

simulating behavior of the victim net during nominal (noiseless) transition by performing steps including, providing a voltage signal transition on an input of a the driver gate;

using a current model of the driver gate and a load model representing the interconnect network, the load model approximating output point admittance of the interconnect network, to produce a nominal driver gate output voltage waveform in response to the input voltage transition; and using a computational model of the interconnect network to propagate the nominal driver gate output voltage waveform to an input of the receiver gate;

simulating behavior of the victim net during noisy transition by performing steps including, providing a voltage signal transition to the input of the driver gate;

providing an aggressor induced current waveform to an output of the driver gate;

using the current model of the driver gate and the load model to produce a noisy driver gate output voltage waveform in response to the input voltage transition and the aggressor induced current waveform; and using the computational model of the interconnect network to propagate the noisy driver gate output voltage waveform to an input of the receiver gate;

producing a value representing a difference between delay associated with the simulated noiseless transition and delay associated with the simulated noisy transition; and saving the produced value to computer readable memory.

52. The article of manufacture of claim 51, wherein simulating behavior of the victim net during nominal (noiseless) transition further includes, using a current model of the receiver gate to produce a receiver gate output waveform resulting from the propagated nominal driver gate output waveform; and wherein simulating behavior of the victim net during noisy transition further includes, using the current model of the receiver gate to produce a receiver gate output waveform resulting from the propagated noisy driver gate output waveform.

53. The article of manufacture of claim 51, wherein simulating behavior of the victim net during nominal (noiseless) transition further includes, using a current model of the receiver gate to produce a receiver gate output waveform resulting from the propagated nominal driver gate output waveform; and wherein simulating behavior of the victim net during noisy transition further includes, providing an aggressor-induced voltage waveform at an input of the receiver gate; and using the current model of the receiver gate to produce a receiver gate output waveform resulting from the propagated noisy driver gate output waveform and the aggressor-induced voltage waveform at an input of the receiver gate.

54. The article of manufacture of claim 51 wherein the information structure further includes:

a model of a load presented by an interconnect network associated with an output of the driver model.

55. The article of manufacture of claim 54, wherein the load model approximates output point admittance of the interconnect network.

56. The article of manufacture of claim 54, wherein the model of the load includes a Π-model.

* * * * *